(12) United States Patent
Gotou

(10) Patent No.: US 8,365,126 B2
(45) Date of Patent: Jan. 29, 2013

(54) METHOD AND APPARATUS FOR SCAN PATH CONNECTION ROUTING

(75) Inventor: Takashi Gotou, Tokyo (JP)

(73) Assignee: NEC Corporation, Tokyo (JP)

(*) Notice: Subject to any disclaimer, the term of this patent is extended or adjusted under 35 U.S.C. 154(b) by 162 days.

(21) Appl. No.: 12/630,619

(22) Filed: Dec. 3, 2009

(65) Prior Publication Data

US 2010/0175039 A1 Jul. 8, 2010

(30) Foreign Application Priority Data

Jan. 7, 2009 (JP) ................................. 2009-1368

(51) Int. Cl.
*G06F 17/50* (2006.01)
*G06F 9/455* (2006.01)

(52) U.S. Cl. ........ 716/122; 716/119; 716/126; 716/130; 716/135

(58) Field of Classification Search .................. None
See application file for complete search history.

(56) References Cited

U.S. PATENT DOCUMENTS

| | | | |
|---|---|---|---|
| 6,378,123 B1 * | 4/2002 | Dupenloup | 716/104 |
| 6,681,356 B1 * | 1/2004 | Gerowitz et al. | 714/729 |
| 6,907,594 B2 * | 6/2005 | Aoki | 716/129 |
| 6,957,408 B1 * | 10/2005 | Teig et al. | 716/129 |
| 7,013,451 B1 * | 3/2006 | Teig et al. | 716/129 |
| 7,162,707 B2 * | 1/2007 | Kanaoka et al. | 716/113 |
| 7,263,679 B2 * | 8/2007 | Kuge et al. | 716/114 |
| 7,900,163 B2 * | 3/2011 | Weiner et al. | 716/132 |
| 7,919,981 B2 * | 4/2011 | Irie | 326/46 |
| 2004/0111689 A1 * | 6/2004 | Kanaoka et al. | 716/13 |
| 2009/0032899 A1 * | 2/2009 | Irie | 257/499 |

FOREIGN PATENT DOCUMENTS

| | | |
|---|---|---|
| JP | 2005147324 A | 6/2005 |
| JP | 2007305642 A | 11/2007 |

* cited by examiner

*Primary Examiner* — A. M. Thompson

(57) ABSTRACT

An integrated circuit design apparatus includes a macro signal terminal position determination unit that determines temporary arrangement positions of a scan-in terminal and a scan-out terminal of each of a number of macros. The unit updates layout information of an integrated circuit based on the temporary arrangement positions. The apparatus includes an initial scan path route determination unit that updates scan path connection information, such that one of the macros arranged in a closest distance is connected in turn starting with a scan-in external terminal, with reference to the updated layout information and the scan path connection information. The apparatus include a scan path re-routing unit that determines a scan path connection order, such that a scan path total wiring length becomes shortest, with reference to the updated layout information and the updated scan path connection information. This unit updates the scan path connection information based on this determined order.

13 Claims, 24 Drawing Sheets

SI: SCAN-IN EXTERNAL TERMINAL
SO: SCAN-OUT EXTERNAL TERMINAL
DIA,DOB,DIC,DOD: GENERAL SIGNAL TERMINAL
SIA-SID: SCAN-IN TERMINALS
SOA-SOD: SCAN-OUT TERMINALS

| from | to |
|------|-----|
| SI | SIC |
| SOC | SID |
| SOD | SIA |
| SOA | SIB |
| SOB | SO |
| DOD | DIA |
| DOB | DIC |

LOGICAL CONNECTION INFORMATION 201

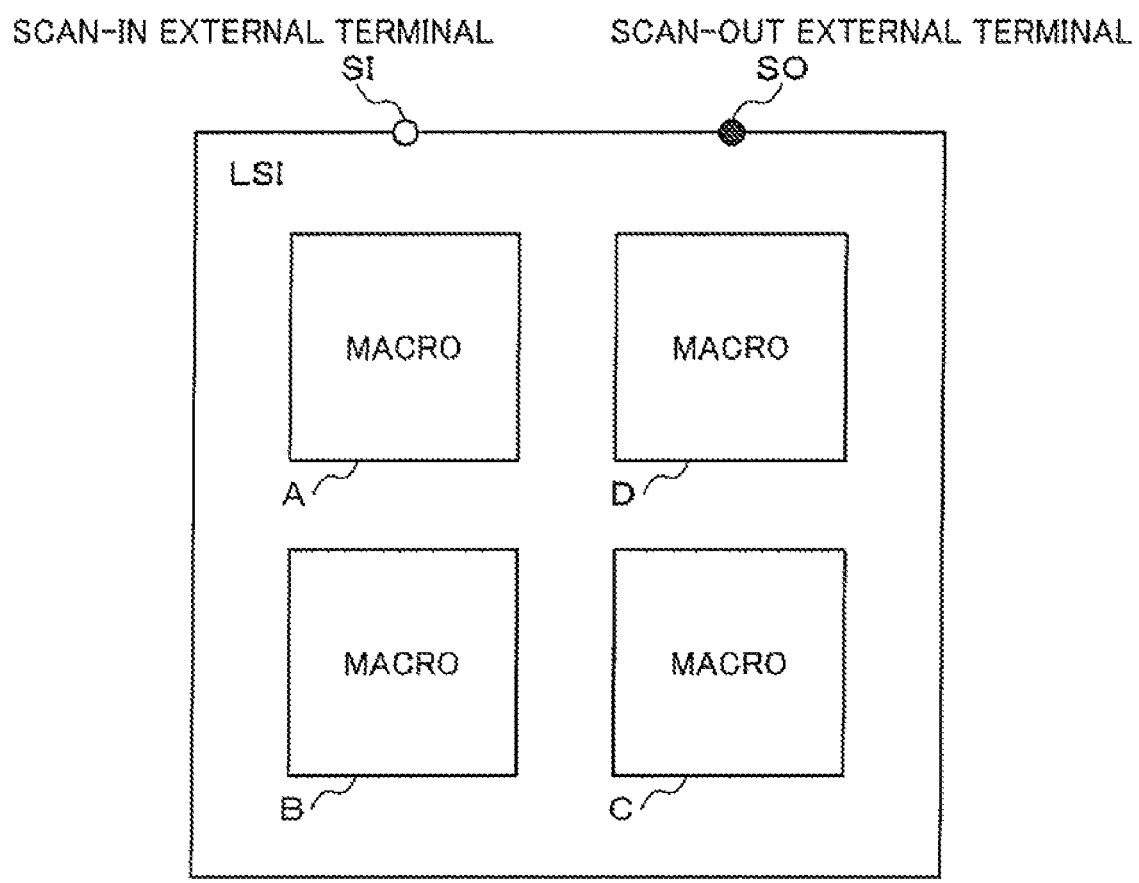

FIG.5

LAYOUT INFORMATION 202

LSI LAYOUT INFORMATION 2021

UNIT (MICROMETER)

| X-COORDINATE POSITION | Y-COORDINATE POSITION | X SIZE | Y SIZE |
|---|---|---|---|
| 0 | 0 | 11 | 11 |

MACRO LAYOUT INFORMATION 2022

UNIT (MICROMETER)

| AMACRO NAME | X-COORDINATE POSITION | Y-COORDINATE POSITION | X SIZE | Y SIZE |
|---|---|---|---|---|
| A | 1 | 6 | 4 | 4 |
| B | 1 | 1 | 4 | 4 |
| C | 6 | 1 | 4 | 4 |
| D | 6 | 6 | 4 | 4 |

TERMINAL LAYOUT INFORMATION 2023

UNIT (MICROMETER)

| TERMINAL NAME | X-COORDINATE POSITION | Y-COORDINATE POSITION | USING LAYER | ARRANGEMENT STATE |
|---|---|---|---|---|
| SI | 3 | 11 | M1 | ARRANGED |
| SIA | — | — | — | NOT ARRANGED YET |
| SIB | — | — | — | NOT ARRANGED YET |
| SIC | — | — | — | NOT ARRANGED YET |
| SID | — | — | — | NOT ARRANGED YET |
| SO | 8 | 11 | M1 | ARRANGED |
| SOA | — | — | — | NOT ARRANGED YET |
| SOB | — | — | — | NOT ARRANGED YET |
| SOC | — | — | — | NOT ARRANGED YET |
| SOD | — | — | — | NOT ARRANGED YET |
| DIA | — | — | — | NOT ARRANGED YET |
| DIC | — | — | — | NOT ARRANGED YET |
| DOB | — | — | — | NOT ARRANGED YET |
| DOD | — | — | — | NOT ARRANGED YET |

FIG.6

| CONNECTION ORDER | MACRO NAME/ SCAN EXTERNAL TERMINAL NAME | SCAN-IN TERMINAL NAME | SCAN-OUT TERMINAL NAME |
|---|---|---|---|
| 1 | SI | — | — |
| 2 | C | SIC | SOC |
| 3 | D | SID | SOD |
| 4 | A | SIA | SOA |
| 5 | B | SIB | SOB |
| 6 | SO | — | — |

203 SCAN PATH CONNECTION INFORMATION

SI: SCAN-IN EXTERNAL TERMINAL
SO: SCAN-OUT EXTERNAL TERMINAL
DIA,DOB,DIC,DOD: GENERAL SIGNAL TERMINAL
SIA-SID: SCAN-IN TERMINALS
SOA-SOD: SCAN-OUT TERMINALS

FIG.8

| TERMINAL NAME | X-COORDINATE POSITION | Y-COORDINATE POSITION | USING LAYER | ARRANGEMENT STATE |
|---|---|---|---|---|
| SI | 3 | 11 | M1 | ARRANGED |
| SIA | 3 | 8 | M1 | ARRANGED |
| SIB | 3 | 3 | M1 | ARRANGED |
| SIC | 8 | 3 | M1 | ARRANGED |
| SID | 8 | 8 | M1 | ARRANGED |
| SO | 8 | 11 | M1 | ARRANGED |
| SOA | 3 | 8 | M1 | ARRANGED |
| SOB | 3 | 3 | M1 | ARRANGED |
| SOC | 8 | 3 | M1 | ARRANGED |
| SOD | 8 | 8 | M1 | ARRANGED |

UNIT (MICROMETER)

2023 TERMINAL LAYOUT INFORMATION

SI: SCAN-IN EXTERNAL TERMINAL
SO: SCAN-OUT EXTERNAL TERMINAL

FIG.10

| MACRO NAME/ TERMINAL NAME | SI | A | B | C | D | SO |
|---|---|---|---|---|---|---|
| SI | / | 1 | 6 | 9 | 4 | / |
| A | 1 | | 1 | 2 | 1 | 4 |
| B | 6 | 1 | | 1 | 2 | 9 |
| C | 9 | 2 | 1 | | 1 | 6 |
| D | 4 | 1 | 2 | 1 | | 1 |
| SO | / | 4 | 9 | 6 | 1 | / |

204 CONNECTION DISTANCE TABLE

| CONNECTION ORDER | MACRO NAME/ SCAN EXTERNAL TERMINAL NAME | SCAN-IN TERMINAL NAME | SCAN-OUT TERMINAL NAME |
|---|---|---|---|
| 1 | SI | — | — |
| 2 | A | SIA | SOA |
| 3 | D | SID | SOD |
| 4 | C | SIC | SOC |
| 5 | B | SIB | SOB |
| 6 | SO | — | — |

203 SCAN PATH CONNECTION INFORMATION

SI: SCAN-IN EXTERNAL TERMINAL
SO: SCAN-OUT EXTERNAL TERMINAL
DIA,DOB,DIC,DOD: GENERAL SIGNAL TERMINAL
SIA~SID: SCAN-IN TERMINALS
SOA~SOD: SCAN-OUT TERMINALS

FIG.14

| CONNECTION ORDER | MACRO NAME/ SCAN EXTERNAL TERMINAL NAME | SCAN-IN TERMINAL NAME | SCAN-OUT TERMINAL NAME |
|---|---|---|---|
| 1 | SI | — | — |
| 2 | A | SIA | SOA |
| 3 | B | SIB | SOB |
| 4 | C | SIC | SOC |
| 5 | D | SID | SOD |
| 6 | SO | — | — |

203 SCAN PATH CONNECTION INFORMATION

SI: SCAN-IN EXTERNAL TERMINAL
SO: SCAN-OUT EXTERNAL TERMINAL
DIA,DOB,DIC,DOD: GENERAL SIGNAL TERMINAL
SIA-SID: SCAN-IN TERMINALS
SOA-SOD: SCAN-OUT TERMINALS

SI: SCAN-IN EXTERNAL TERMINAL
SO: SCAN-OUT EXTERNAL TERMINAL
DIA,DOB,DIC,DOD: GENERAL SIGNAL TERMINAL
SIA-SID: SCAN-IN TERMINALS
SOA-SOD: SCAN-OUT TERMINALS

FIG.18

UNIT (MICROMETER)

| TERMINAL NAME | X-COORDINATE POSITION | Y-COORDINATE POSITION | USING LAYER | ARRANGEMENT STATE |
|---|---|---|---|---|
| SI | 3 | 11 | M1 | ARRANGED |
| SIA | 3 | 8 | M1 | ARRANGED |
| SIB | 3 | 3 | M1 | ARRANGED |
| SIC | 8 | 3 | M1 | ARRANGED |
| SID | 8 | 8 | M1 | ARRANGED |
| SO | 8 | 11 | M1 | ARRANGED |
| SOA | 3 | 8 | M1 | ARRANGED |
| SOB | 3 | 3 | M1 | ARRANGED |
| SOC | 8 | 3 | M1 | ARRANGED |
| SOD | 8 | 8 | M1 | ARRANGED |
| DIA | 5 | 3 | M1 | ARRANGED |
| DIC | 6 | 3 | M1 | ARRANGED |
| DOB | 5 | 3 | M1 | ARRANGED |
| DOD | 6 | 8 | M1 | ARRANGED |

2023 TERMINAL LAYOUT INFORMATION

SI: SCAN-IN EXTERNAL TERMINAL
SO: SCAN-OUT EXTERNAL TERMINAL
DIA,DOB,DIC,DOD: GENERAL SIGNAL TERMINAL
SIA-SID: SCAN-IN TERMINALS
SOA-SOD: SCAN-OUT TERMINALS

| from | to |
|------|-----|
| SI   | SIA |
| SOA  | SIB |
| SOB  | SIC |
| SOC  | SID |
| SOD  | SO  |
| DOD  | DIA |
| DOB  | DIC |

LOGICAL CONNECTION INFORMATION 201

SI: SCAN-IN EXTERNAL TERMINAL
SO: SCAN-OUT EXTERNAL TERMINAL
DIA,DOB,DIC,DOD: GENERAL SIGNAL TERMINAL
SIA-SID: SCAN-IN TERMINALS
SOA-SOD: SCAN-OUT TERMINALS

FIG.22

UNIT (MICROMETER)

| TERMINAL NAME | X-COORDINATE POSITION | Y-COORDINATE POSITION | USING LAYER | ARRANGEMENT STATE |
|---|---|---|---|---|
| SI | 3 | 11 | M1 | ARRANGED |
| SIA | 3 | 8 | M1 | ARRANGED |
| SIB | 3 | 3 | M1 | ARRANGED |
| SIC | 8 | 3 | M1 | ARRANGED |
| SID | 8 | 8 | M1 | ARRANGED |
| SO | 8 | 11 | M1 | ARRANGED |
| SOA | 3 | 8 | M1 | ARRANGED |
| SOB | 3 | 3 | M1 | ARRANGED |
| SOC | 8 | 3 | M1 | ARRANGED |
| SOD | 8 | 8 | M1 | ARRANGED |
| DIA | 5 | 8 | M1 | ARRANGED |
| DIC | 6 | 3 | M1 | ARRANGED |
| DOB | 5 | 3 | M1 | ARRANGED |
| DOD | 6 | 8 | M1 | ARRANGED |

2023 TERMINAL LAYOUT INFORMATION

-- RELATED ART --

SI: SCAN-IN EXTERNAL TERMINAL
SO: SCAN-OUT EXTERNAL TERMINAL
DIA,DOB,DIC,DOD: GENERAL SIGNAL TERMINAL
SIA-SID: SCAN-IN TERMINALS
SOA-SOD: SCAN-OUT TERMINALS

SI: SCAN-IN EXTERNAL TERMINAL
SO: SCAN-OUT EXTERNAL TERMINAL
DIA,DOB,DIC,DOD: GENERAL SIGNAL TERMINAL
SIA-SID: SCAN-IN TERMINALS
SOA-SOD: SCAN-OUT TERMINALS

METHOD AND APPARATUS FOR SCAN PATH CONNECTION ROUTING

This application is based upon and claims the benefit of priority from Japanese Patent Application No. 2009-001368, filed on Jan. 7, 2009, the disclosure of which is incorporated herein in its entirety by reference.

TECHNICAL FIELD

The present invention relates to an integrated circuit design apparatus, a design method and a storage media, and, more particularly, to an integrated circuit design apparatus, a design method and a storage media which facilitate optimization of wiring length.

BACKGROUND ART

In a layout design of a large-scale integrated circuit such as LSI (Large Scale Integration) or the like, a method to reduce the design period by using a hierarchical layout design is used widely. The hierarchical layout design is a method in which a chip is divided into a design unit called a macro and layout processing of each macro is carried out in a parallel way. The macro is also generally called a block or a macro block.

In the above-mentioned hierarchical layout design, a top-down oriented processing procedure like following is widely used.

First, the hierarchic structure of data of a LSI chip is determined.

Then, the position and the size of macros on the LSI chip, and the terminal positions of macros are determined (floor planning processing).

Finally, top-layout processing (i.e., wiring processing between macros), and layout processing and wiring processing in macros are carried out according to the terminal positions determined.

In such a layout design of LSI, the terminal positions of macros are determined so that a wiring route between macros may become shortest based on the size of each macro and connection relation and relative position relation between each macro.

For example, related technology of hierarchical layout design is described in Japanese Patent Application Publication No. 2005-147324.

The automatic alignment/wiring processing method described on this patent application (document 1) has a step in which the terminal positions of macros are re-determined with reference to the result of layout wiring within each of the macros which is obtained by performing hierarchical layout design mentioned above.

This automatic alignment/wiring processing method enables to reduce a roundabout of wiring between macros by carrying out this step.

Further, related technology of layout design is disclosed in Japanese Patent Application Publication No. 2007-305642.

The layout design method indicated on this patent application (document 2) has a step in which an order of connections of scan flip-flops is determined in consideration of scan path length and a step in which nodes between scan paths are exchanged.

This layout design method enables to reduce the total scan path length by carrying out these steps.

A specific example of the related technology described above will be explained using FIG. 25 and FIG. 26.

FIG. 25 indicates a scan path connection order and terminal positions in a layout after performing floor planning of a LSI.

Macros A, B, C and D that are targets of layout design of the LSI are arranged in the LSI.

Scan-in external terminal SI and scan-out external terminal SO of the LSI are arranged on the periphery of the LSI.

Each of macros A-D also includes scan-in terminals SIA-SID and scan-out terminals SOA-SOD respectively.

Scan-in terminal SIA/scan-out terminal SOA, scan-in terminal SIB/scan-out terminal SOB, scan-in terminal SIC/scan-out terminal SOC and scan-in terminal SID/scan-out terminal SOD are arranged on the peripheries of macro A, macro B, macro C and macro D respectively.

The scan path connection order is determined at the stage of logic design before performing floor planning.

At this occasion, the scan-in terminal of each macro is connected to only one terminal that is the scan-in external terminal or one of the scan-out terminals of different macros.

Similarly, a scan-out terminal is connected to only one terminal that is the scan-out external terminal or one of the scan-in terminals of different macros.

In the example of FIG. 25, the scan path is connected in order of macro C->macro D->macro A->macro B->scan-out external terminal SO, with scan-in external terminal SI being the starting point.

Incidentally, in the following description, for example, when the scan path connection order between macros is scan-in external terminal SI->macro C->macro D->macro A->macro B->scan-out external terminal SO, it is expressed as SI-C-D-A-B-SO.

Here, like other terminals, the positions of scan-in terminals SIA, SIB, SIC and SID and scan-out terminals SOA, SOB, SOC and SOD of the respective macros are arranged in positions where an each of distances between terminals becomes shortest.

Next, a layout after performing scan re-routing processing based on the floor plan of FIG. 25 is shown in FIG. 26.

A scan path is a path in which, as their own nature, all shift registers and all macros including shift registers only have to be connected like a continuous line drawn by a single stroke of a brush without lifting it from a paper. Thus, in many cases, there are no restrictions in particular about an order of their connections.

In such cases, it is possible to change the scan path connection order (scan re-routing) in consideration of the arrangement positions of macro terminals and shift registers that have been determined so that the total wiring length of the scan path may become shorter. For this reason, automated re-routing processing is generally performed.

By re-routing processing, connections of the scan path are made in order of SI-A-B-C-D-SO as shown in FIG. 26.

This is the most suitable scan path connection order in this layout and is the optimal solution of the total wiring length of the scan path.

SUMMARY

An exemplary object of the invention is to provide an integrated circuit design apparatus, a design method and a program that enables to obtain scan path connection information that derives an optimal solution of a scan path total wiring length in which room for further shortening the scan path total wiring length is reduced.

An integrated circuit design apparatus according to an exemplary aspect of the invention includes: a layout information storing unit which stores layout information that indicates a layout in an integrated circuit; a scan path connection information storing unit which stores scan path connection information that indicates a connection order of scan path terminals in the integrated circuit; a macro signal terminal position determination unit which determines temporary arrangement positions of a scan-in terminal and a scan-out terminal of each of a plurality of macros with reference to the layout information, and updates the layout information based on the temporary arrangement positions determined; an initial scan path route determination unit which updates the scan path connection information such that, about a scan-in external terminal and the plurality of macros, one of the plurality of macros arranged in a closest distance is connected in turn starting with the scan-in external terminal with reference to the layout information updated by the macro signal terminal position determination unit and the scan path connection information; and a scan path re-routing unit which determines a scan path connection order such that the scan path total wiring length becomes shortest with reference to a layout information updated by the macro signal terminal position determination unit and the scan path connection information updated by the initial scan path route determination unit, and updates the scan path connection information updated by the initial scan path route determination unit based on the determined scan path connection order.

A design method according to an exemplary aspect of the invention includes: a first update step for determining temporary arrangement positions of a scan-in terminal and a scan-out terminal of each of a plurality of macros with reference to layout information that indicates a layout in an integrated circuit stored in a layout information storing unit, and for updating the layout information based on the temporary arrangement position determined; a second update step for updating a scan path connection information such that, about a scan-in external terminal and the plurality of macros, one of the plurality of macros arranged in a closest distance is connected in turn starting with the scan-in external terminal with reference to the layout information updated in the first update step and scan path connection information stored in a scan path connection information storing unit that indicates a connection order of scan path terminals in the integrated circuit; and a third update step for determining a scan path connection order such that a scan path total wiring length becomes shortest with reference to the layout information updated in the first update step and the scan path connection information updated in the second update step, and for updating the scan path connection information updated in the second update step based on the determined scan path connection order.

A computer readable medium recording thereon embodying a program, according to an exemplary aspect of the invention, enabling a computer to: determine temporary arrangement positions of a scan-in terminal and a scan-out terminal of each of a plurality of macros with reference to layout information that indicates a layout in an integrated circuit stored in a layout information storing unit, and update the layout information to a first updated layout information based on the determined temporary arrangement position; updating a scan path connection information stored in a scan path connection information storing unit that indicates a connection order of scan path terminals in the integrated circuit to a first updated scan path connection information such that, about a scan-in external terminal and the plurality of macros, one of the plurality of macros arranged in a closest distance is connected in turn starting with the scan-in external terminal with reference to the first updated layout information and the scan path connection information; and determining a scan path connection order such that the scan path total wiring length becomes shortest with reference to the first updated layout information and the first updated scan path connection information, and updating the first updated scan path connection information to second updated scan path connection information based on the determined scan path connection order.

BRIEF DESCRIPTION OF THE DRAWINGS

Exemplary features and advantages of the present invention will become apparent from the following detailed description when taken with the accompanying drawings in which:

FIG. 4 is a diagram showing the physical structure of an example of LSI of processing object in the first and a second exemplary embodiment;

FIG. 5 is a diagram showing the structure of layout information in the first and second exemplary embodiments;

FIG. 6 is a diagram showing the structure of scan path connection information in the first and second exemplary embodiments;

FIG. 8 is a diagram showing terminal layout information of layout information updated by a macro signal terminal position determination unit of the first exemplary embodiment;

FIG. 10 is a diagram showing the structure of a connection distance table in the first and second exemplary embodiments;

FIG. 14 is a diagram showing scan path connection information changed by scan path re-rerouting in the first and second exemplary embodiments;

FIG. 18 is a diagram showing terminal layout information of layout information updated by a macro signal terminal position determination unit of the second exemplary embodiment;

FIG. 22 is a diagram showing terminal layout information of layout information updated by a macro scan terminal position determination unit of the first and second exemplary embodiments;

EXEMPLARY EMBODIMENT

Next, an exemplary embodiment will be described.

Figures 2, 3:
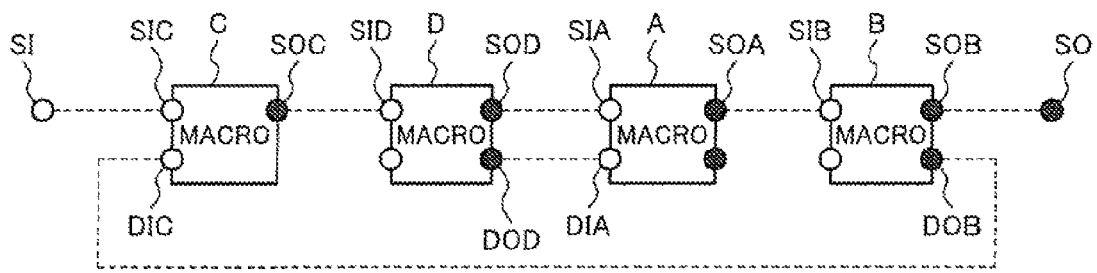
FIG. 2 is a diagram showing a logical connection of an example of LSI of processing object in the first and a second exemplary embodiment.
FIG. 3 is a diagram showing the structure of logical connection information in the first and second exemplary embodiments.

Hereinafter, description will be made taking a LSI including the logical connection as shown in FIG. 2, and the physical structure as shown in FIG. 4, as an example. In addition, a target LSI of this exemplary embodiment is not limited to the examples indicated herein in terms of the number of macros, logical connections, physical arrangements and ordinary cells except for a macro, IO cells and their terminals and the like.

Figure 1:
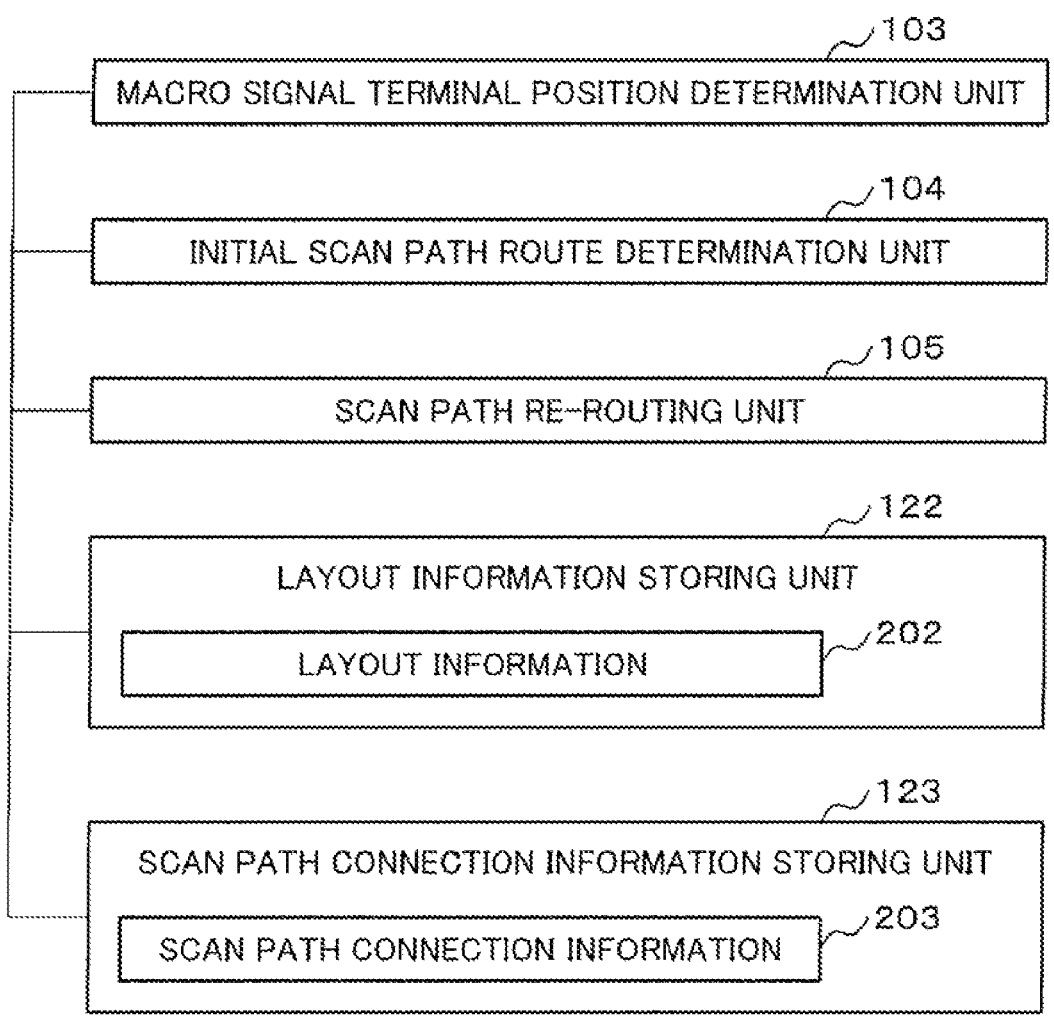
FIG. 1 is a block diagram showing a configuration of a first exemplary embodiment.

Referring now to FIG. 1, the first exemplary embodiment includes macro signal terminal position determination unit 103, initial scan path route determination unit 104, scan path re-routing unit 105, layout information storing unit 122 and a scan path connection information storing unit 123

Here, before describing each component, the structure of data which each component refers to, generates and updates will be described.

Layout information 202 is information that information on a layout of scan-in external terminal SI, scan-out external terminal SO and macros A-D as shown in FIG. 4, for example, is converted into digital information as shown in FIG. 5.

In the example shown in FIG. 5, layout information 202 includes LSI layout information 2021, macro layout information 2022 and terminal layout information 2023. LSI layout information 2021 includes information on the position and the size of a LSI. Macro layout information 2022 includes information on the position and the size of macros A-D. Terminal layout information 2023 includes terminal location information and an arrangement state of each of scan-in external terminal SI, scan-out external terminal SO, scan-in terminals SIA-SID, scan-out terminals SOA-SOD, general signal terminal DIA, general signal terminal DOB, general signal terminal DIC and general signal terminal DOD.

As shown in FIG. 6, scan path connection information 203 includes fields of Macro name/Scan external terminal name, Scan-in terminal name and Scan-out terminal name corresponding to each Macro name, and Connection order of macros A-D, scan-in external terminal SI and scan-out external terminal SO indicated by Macro name/Scan external terminal name.

As shown in FIG. 10, connection distance table 204 includes information on the mutual distance between scan-in external terminal SI, scan-out external terminal SO and macros A-D.

Macro signal terminal position determination unit 103 refers to layout information 202 and determines temporary arrangement positions of scan-in terminals SIA-SID and scan-out terminals SOA-SOD. Then, macro signal terminal position determination unit 103 updates layout information 202 based on these temporary arrangement positions determined.

Initial scan path route determination unit 104 determines connecting paths of the scan path so that each two of macros A-D with a close mutual distance may be connected based on layout information 202 updated by macro signal terminal position determination unit 103 and scan path connection information 203. Then, initial scan path route determination unit 104 updates scan path connection information 203 based on the determined connecting paths of the scan path.

Scan path re-routing unit 105 determines a scan path connection order so that the scan path total wiring length may become shortest based on scan path connection information 203 updated by initial scan path route determination unit 104 and layout information 202 updated by macro signal terminal position determination unit 103. Here, the scan path total wiring length is the total distance made by summing the distance of each scan path route between scan-in external terminal SI, scan-out external terminal SO and a side of respective macros A-D. Scan path re-routing unit 105 updates scan path connection information 203 based on this determined scan path total wiring length.

Layout information storing unit 122 and scan path connection information storing unit 123 store layout information 202 and scan path connection information 203, respectively. In addition, it may be included such that any one or more of layout information storing unit 122 and scan path connection information storing unit 123 are included in any one of macro signal terminal position determination unit 103, initial scan path route determination unit 104 and scan path re-routing unit 105. Alternatively, it may be included such that any one or more of layout information storing unit 122 and scan path connection information storing unit 123 are included together in a memory unit which is not illustrated.

Next, operation of this exemplary embodiment will be described more in detail by showing a specific example with reference to FIGS. 1-15.

As a premise, it is supposed that the contents shown in FIG. 5 and FIG. 6 are stored in layout information 202 and scan path connection information 203, respectively.

Moreover, in layout information 202 of the initial state shown in FIG. 5, contents that have been determined are stored in the fields of the position and the size of LSI and macros A-D and of the terminal position of scan-in external terminal SI and scan-out external terminal SO. Because it is in the state that the terminal positions of scan-in terminals SIA-SID and scan-out terminals SOA-SOD of macros A-D have not been determined yet, effective contents are not being stored and instead "not arranged yet" is being stored in the corresponding entries of Arrangement state.

In scan path connection information 203 of the initial state shown in FIG. 6, the order of connections is in the state that the logical connection of LSI shown in FIG. 2 is reflected, but the physical structure of the LSI shown in FIG. 4 is not being considered.

First, macro signal terminal position determination unit 103 refers to layout information 202 and determines the temporary arrangement positions of scan-in terminals SIA-SID and scan-out terminals SOA-SOD. Then, macro signal terminal position determination unit 103 updates layout information 202 based on the determined temporary arrangement positions (step S302 in FIG. 11).

Figure 7:
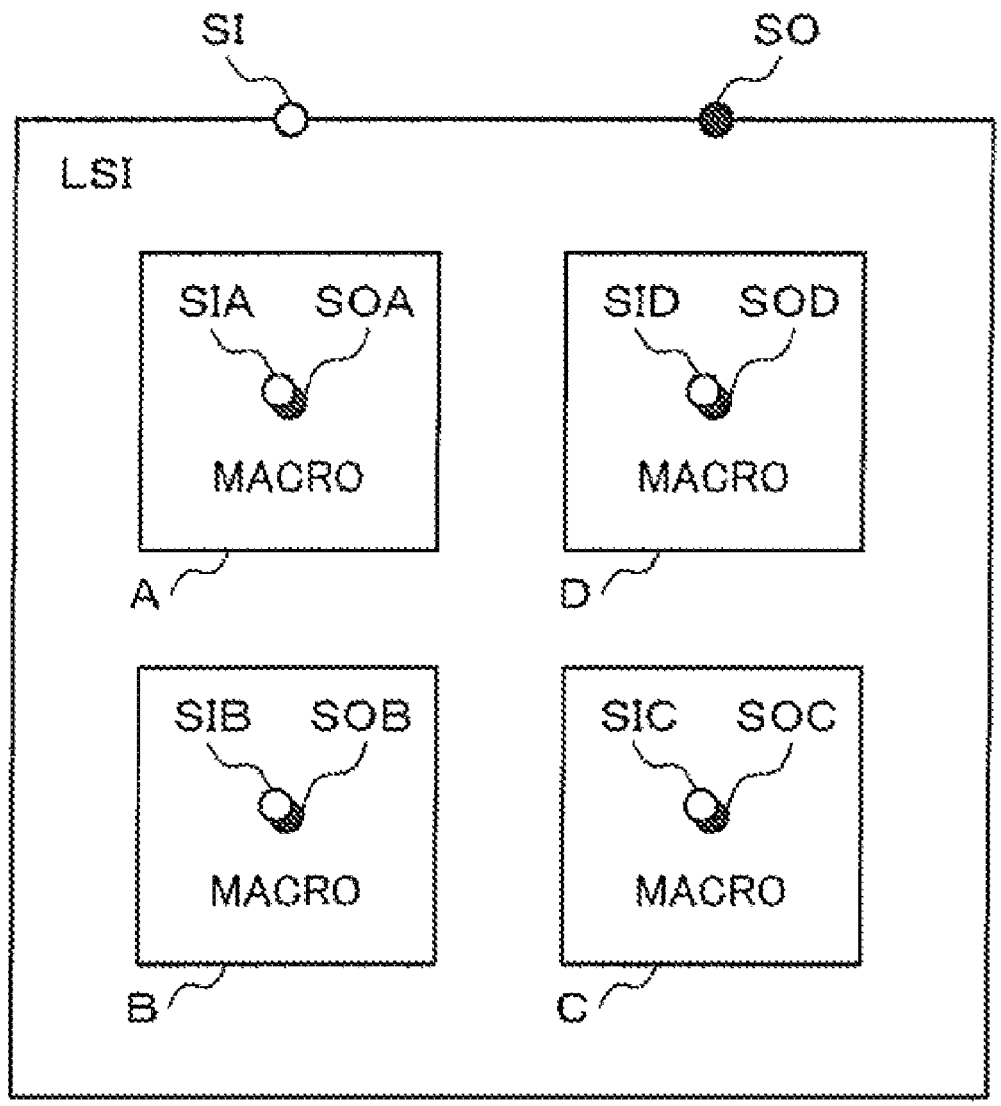
FIG. 7 is a diagram showing a scan-in and a scan-out terminal position of a macro determined by a macro signal terminal position determination unit of the first exemplary embodiment.
Figure 9:
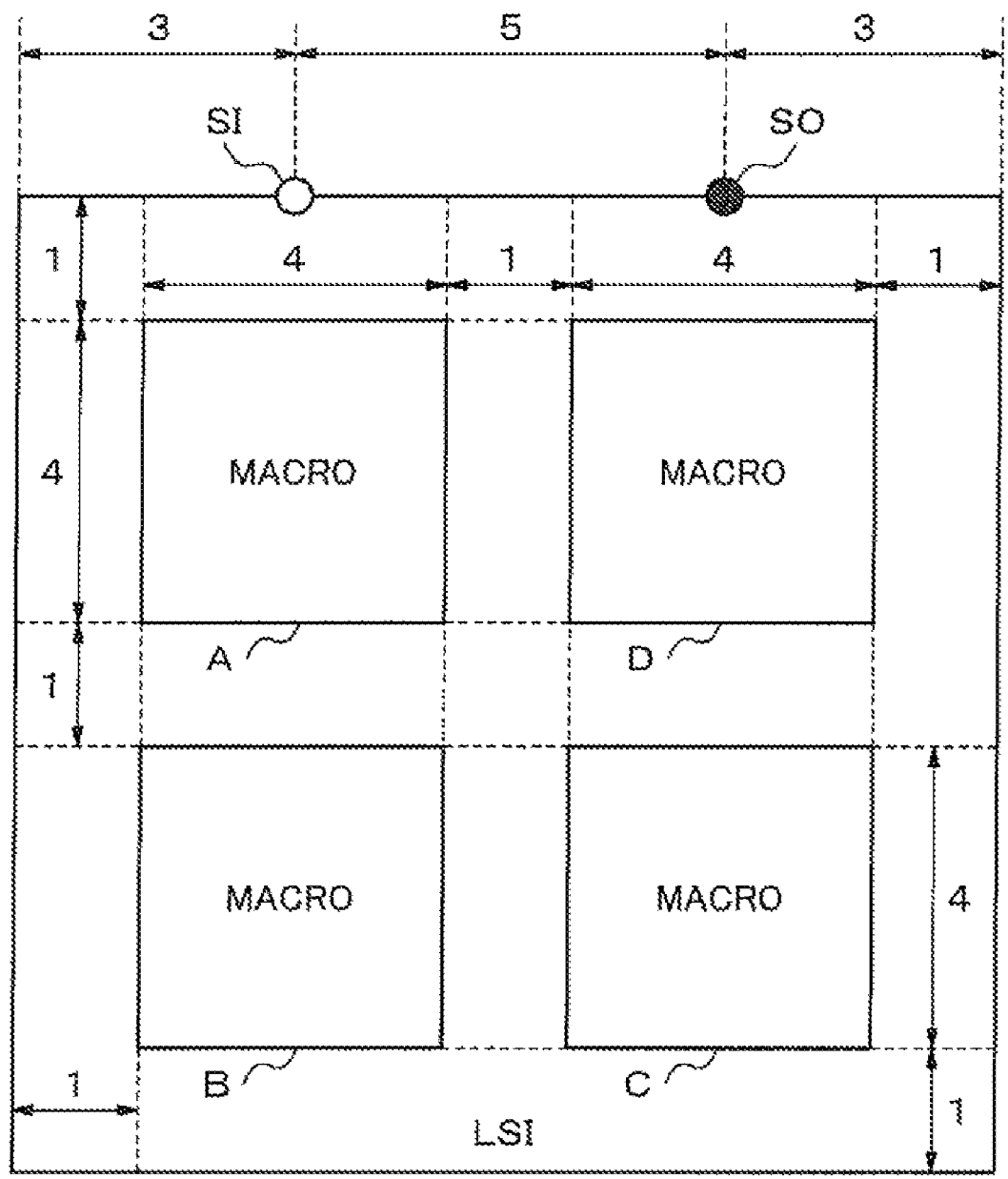
FIG. 9 is a diagram which indicates the physical structure of an example of a processing object LSI in the first and second exemplary embodiments including the dimensions and a distance of each part.
Figure 11:
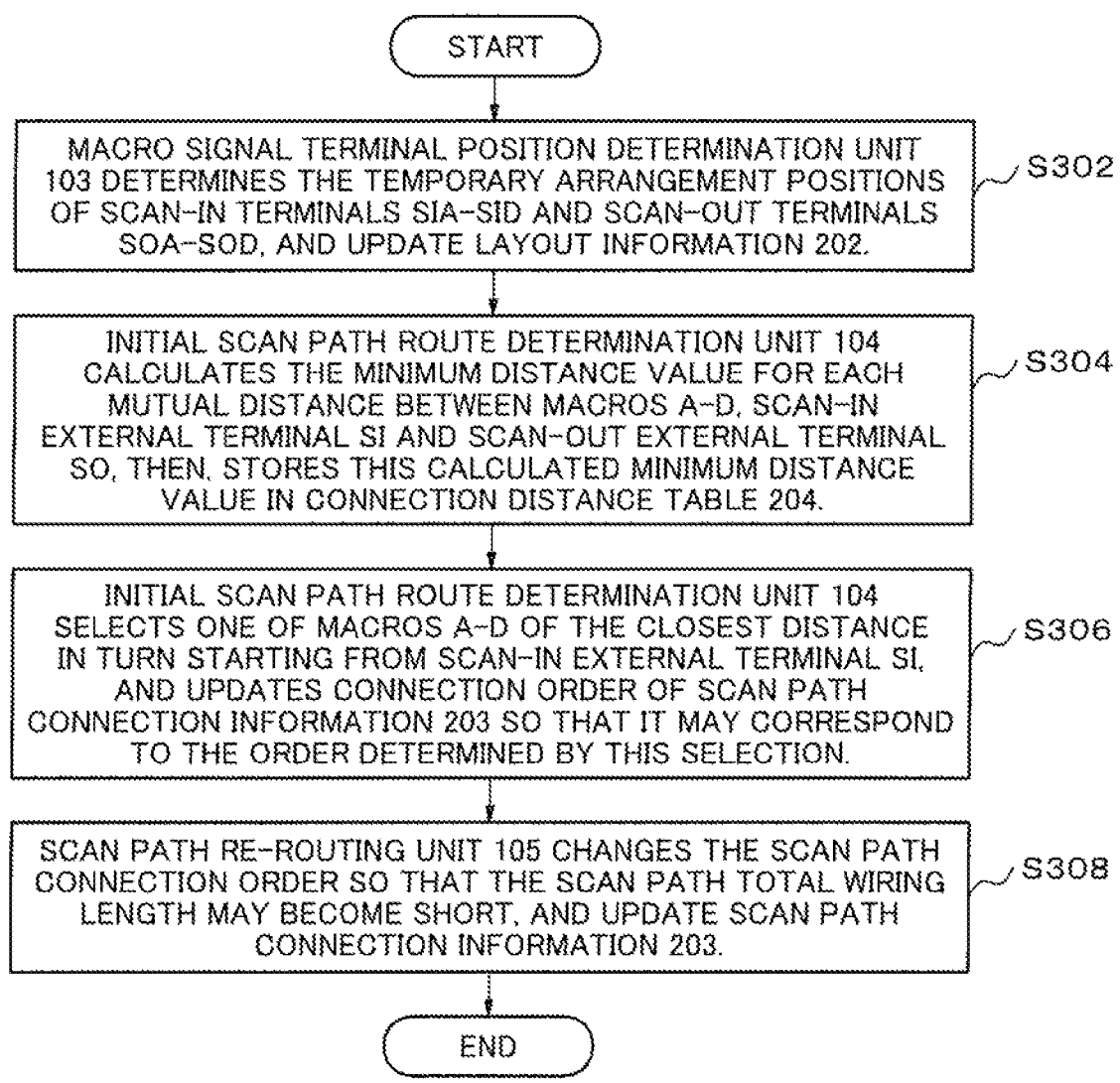
FIG. 11 is a flowchart showing general operation of the first exemplary embodiment.

Scan-in and scan-out terminal positions of macros A-D determined by macro signal terminal position determination unit 103 are shown in FIG. 7. Scan-in terminals SIA-SID and scan-out terminals SOA-SOD are temporary-arranged on the center of gravity of respective macros A-D. Meanwhile, in FIG. 7, although scan-in terminal SIA and scan-out terminal SOA are indicated overlapping partially (out of alignment partially) in order to enable them to be identified on the figure, actually, they are arranged on the same centroid position in a lapped manner. Terminal layout information 2023 of layout information 202 updated by macro signal terminal position determination unit 103 is shown in FIG. 8.

Next, initial scan path route determination unit 104 refers to scan path connection information 203 and layout information 202 changed by macro signal terminal position determination unit 103, and determines connecting paths of the scan path so that each two of macros A-D with a close mutual distance may be connected. Then, initial scan path route determination unit 104 updates scan path connection information 203 based on this determined connecting paths of the scan path.

Here, an example of the detailed procedure of updating scan path connection information 203 will be described. First, initial scan path route determination unit 104 calculates a minimum distance value for each mutual distance between macros A-D, scan-in external terminal SI and scan-out external terminal SO. Then, Initial scan path route determination unit 104 stores this calculated minimum distance value in connection distance table 204 in initial scan path route determination unit 104 as shown in FIG. 10 (step S304 in FIG. 11). For example, in the layout shown in FIG. 9, "1" is registered as the minimum distance from scan-in external terminal SI to a side of macro A, and "6" as the minimum distance to the macro B. Further, the minimum distance values between the terminals and the macros except the above are also registered in the same way.

Then, initial scan path route determination unit 104 refers to connection distance table 204, and selects one of macros A-D of the closest distance in turn starting from scan-in external terminal SI. In this occasion, when there are any macros A-D which have been already selected, initial scan path route determination unit 104 selects one with the closest distance among macros A-D which have not been selected yet. When all macros A-D have been already selected, initial scan path route determination unit 104 selects scan-out external terminal SO. And, initial scan path route determination unit 104 updates Connection order of scan path connection information 203 so that it may correspond to the order determined by this selection (step S306 in FIG. 11).

Figure 12:
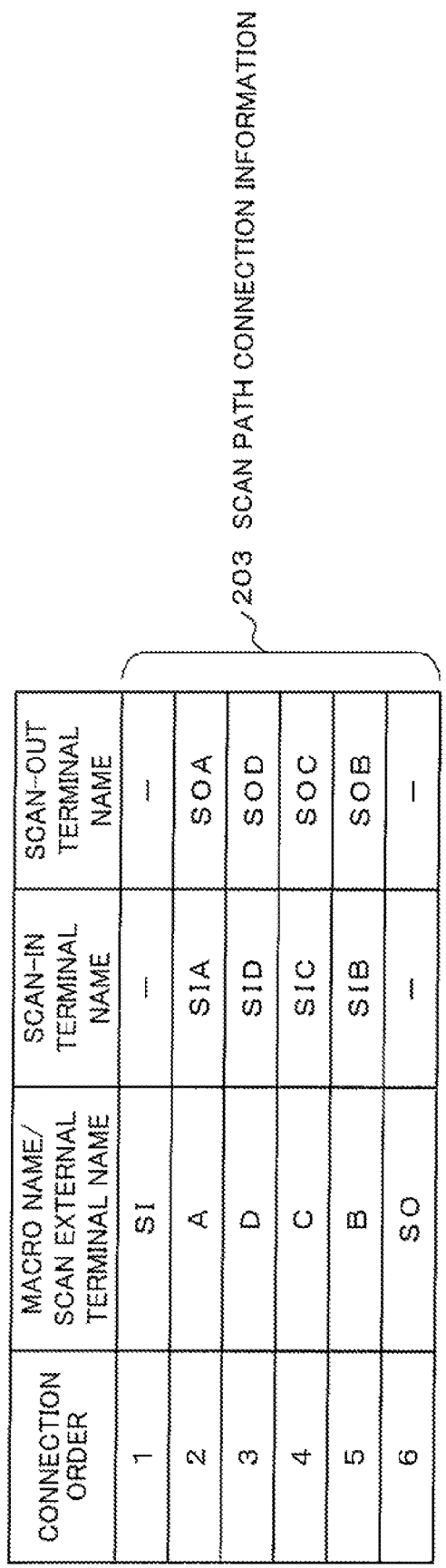
FIG. 12 is a diagram showing scan path connection information changed by an initial scan path route determination unit of the first and second exemplary embodiments.
Figure 13:
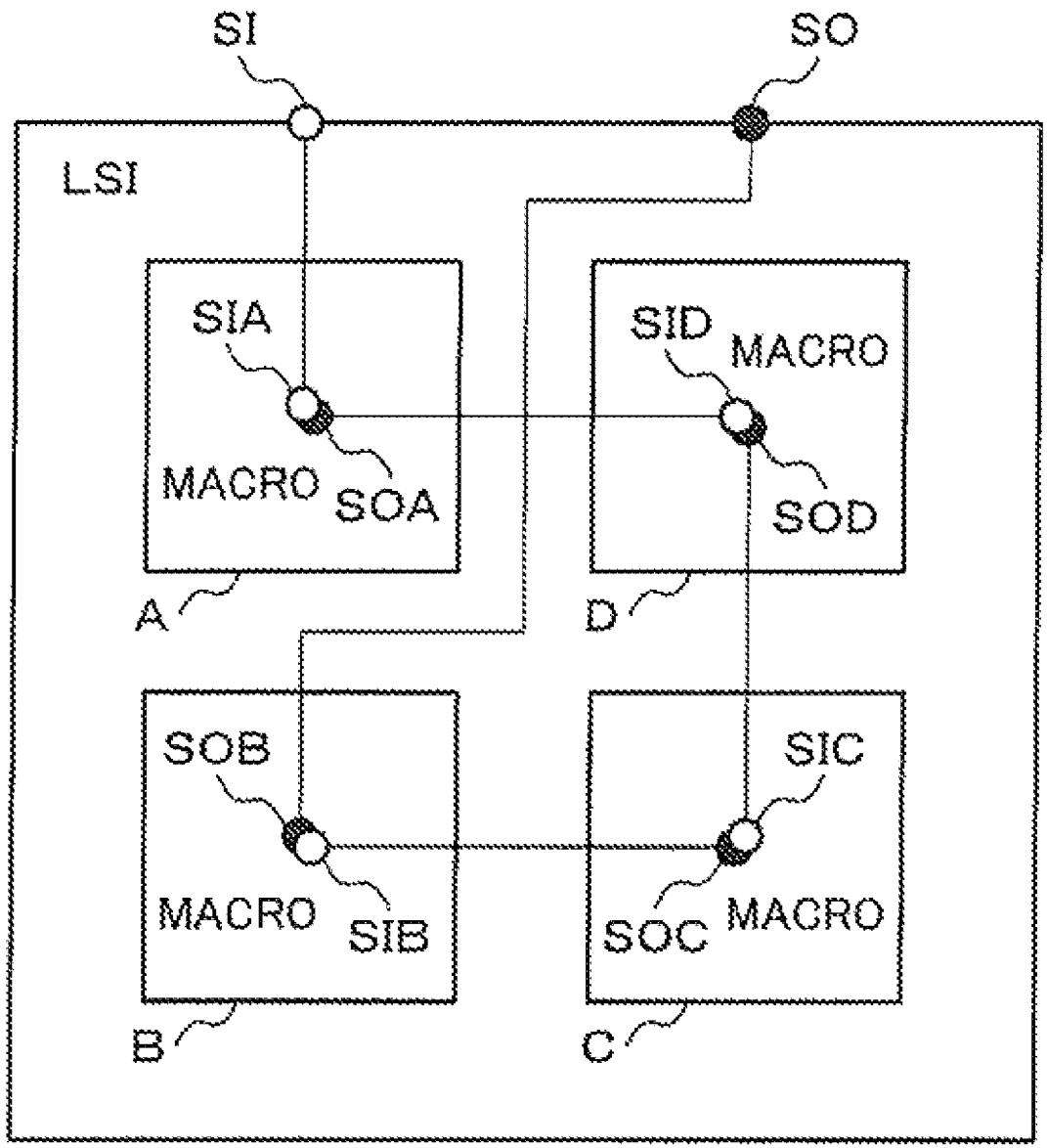
FIG. 13 is a connection image diagram of a scan path based on scan path connection information changed by an initial scan path route determination unit of the first and second exemplary embodiments.
Figure 15:
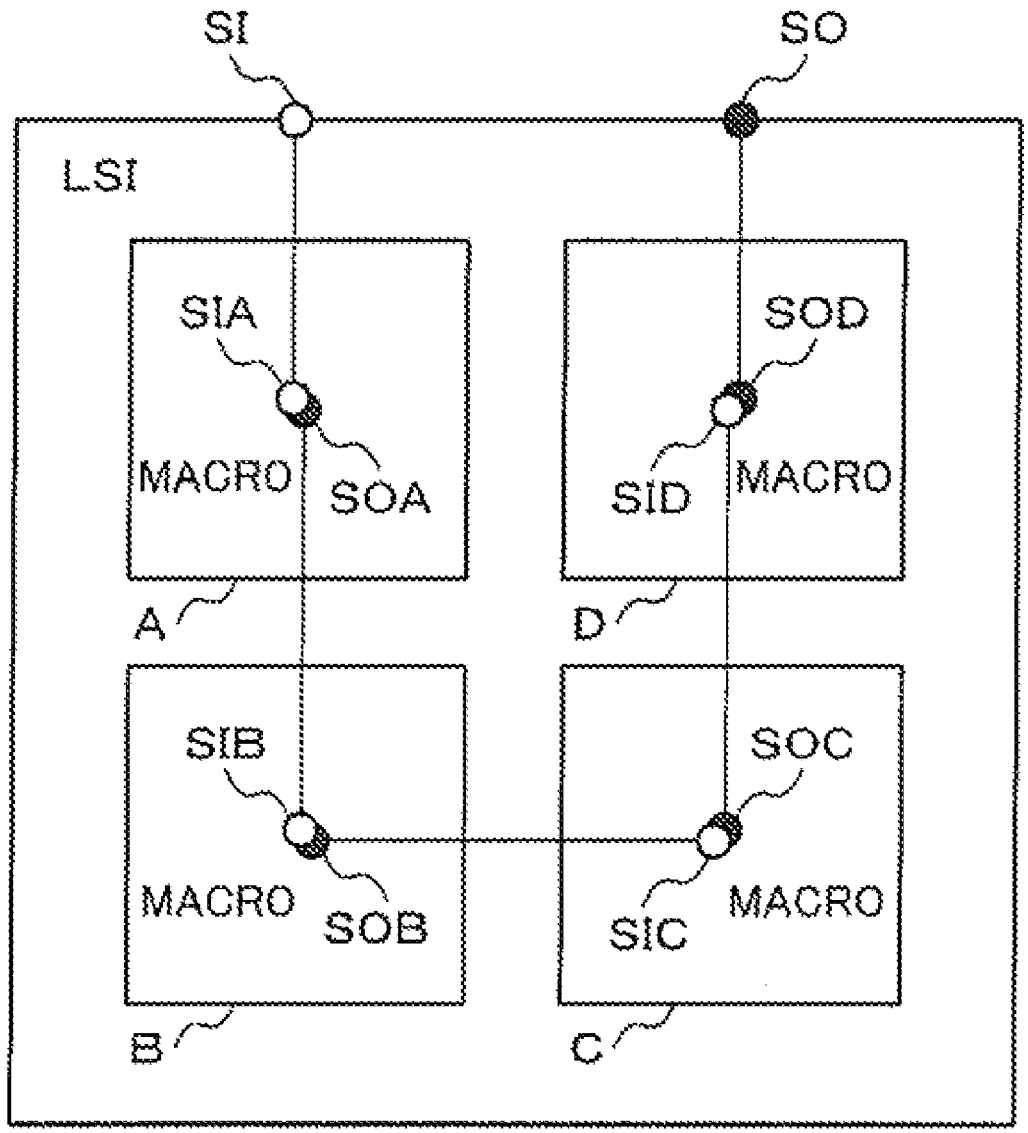
FIG. 15 is a connection image diagram of a scan path based on scan path connection information changed by scan path re-routing in the first and second exemplary embodiments.

For example, in connection distance table 204 of FIG. 10, macro A closest to scan-in external terminal SI (distance "1") is selected first, and next, macro B or macro D which is the closest from macro A (both distance "1") is selected. It is supposed that macro D is selected here. Seen from macro D, macro A and macro C are of the minimum distance. However, because macro A has been already selected, macro C (distance "1") is selected. After that, similar processing is performed until final selection is completed. In FIG. 12, scan path connection information 203 updated by initial scan path route determination unit 104 based on the result of the completed selection processing is shown. Connection order of scan path connection information 203 is changed to SI-A-D-C-B-SO in the example of this exemplary embodiment. In the connection of the scan path connected based on scan path connection information 203 shown in FIG. 12, as shown in the connection image of a scan path in FIG. 13, it can be seen that the distance from macro B to scan-out external terminal SO is large, and the scan path total wiring length is "15".

Next, scan path re-routing unit 105 changes the scan path connection order with reference to scan path connection information 203 updated by initial scan path route determination unit 104 and layout information 202 changed by macro signal terminal position determination unit 103 so that the scan path total wiring length may become short. Then, scan path re-routing unit 105 updates scan path connection information 203 based on this changed scan path connection order (step S308 in FIG. 11).

Here, like initial scan path route determination unit 104, scan path re-routing unit 105 obtains a path whose distance is shortest among paths between a side of macros A-D that connect between macros A-D in turn, and calculates the scan path total wiring length as the total distance of the obtained paths.

As a specific method of re-routing processing, a solution method to a traveling salesman problem which is one of combinational optimization problems can be used. For example, processing in which optional 2 points or 3 points except for the starting point and the terminal point are exchanged in a sequential manner (for example, the order of SI-A-C-D-B-SO is changed to SI-C-A-D-B-SO), and order with a shorter total wiring length is adopted is performed. There are methods such as a method to repeat this processing until total wiring length adopted becomes equal to or shorter than a predetermined percentage of the initial total wiring length and a method to repeat the processing until the number of repetition exceeds a predetermined value.

Scan path connection information 203 changed by scan path re-routing unit 105 is shown in FIG. 14. All connections of the scan path connected based on scan path connection information 203 shown in FIG. 14 are connected in the minimum distance like the connection image of the scan path shown in FIG. 15. It can be seen that the scan path total wiring length in this case is "5".

Here, the number of combinations of scan path routes which can be re-routed is, when the number of macros is n, factorial of n. In the example of this exemplary embodiment, the number of macros is four and the number of combinations is factorial of four, or 24. By trying all combinations of the scan path routes in a best-subset selection procedure like manner, it is possible to find an optimal solution of a route (that is, SI-A-B-C-D-SO in this case, which is the same route as one quoted in the related technology). However, when n is a value of several dozen, and it is not practical to try all combinations, an approximate solution found in a practical time may be deemed as an optimal solution as mentioned above.

The effect in this exemplary embodiment mentioned above is that, as an optimal solution of the scan path total wiring length, scan path connection information that reduces room for further shortening the scan path total wiring length can be obtained. The reason of this is that the scan path connection order is re-routed so that the scan path total wiring length may become short with reference to scan path connection information and layout information, allowing scan path connection information to be updated.

That is, first, in layout design of LSI, processing to arrange the scan-in and scan-out terminal positions of a hierarchical macro when performing hierarchical partitioning design at the centroid position of the macro once temporarily is carried out. Following this, optimization processing of a scan path route is performed in consideration of the minimum distance between macros or the minimum distance between terminals for which temporary arrangement have been performed. As a result, there is the effect that, as an optimal solution of the scan path total wiring length, it is possible to obtain scan path connection information in which room for further shortening the scan path total wiring length is reduced.

Next, the second exemplary embodiment will be described in detail with reference to drawings.

Figure 16:
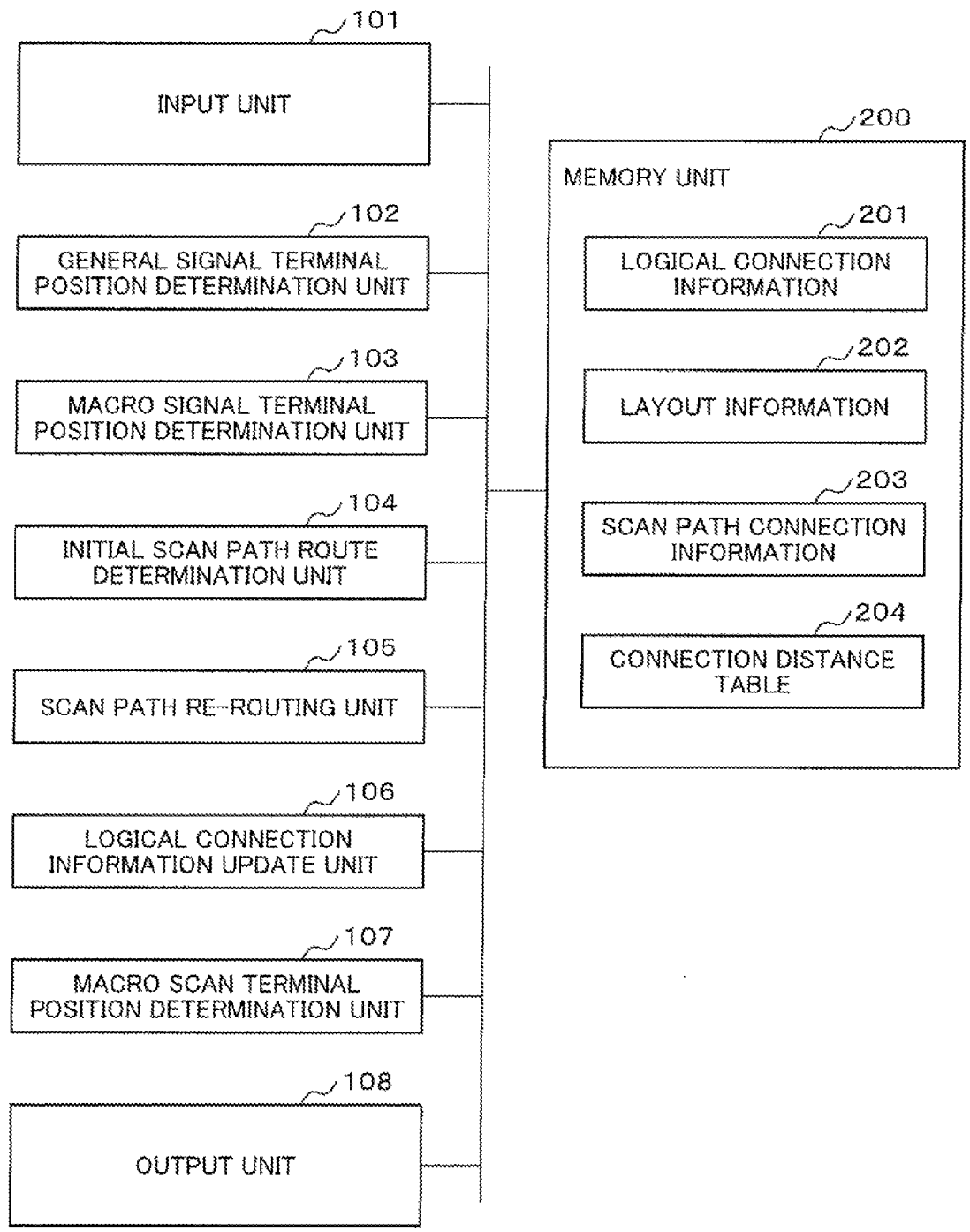
FIG. 16 is a block diagram showing the configuration of the second exemplary embodiment.
Figure 17:
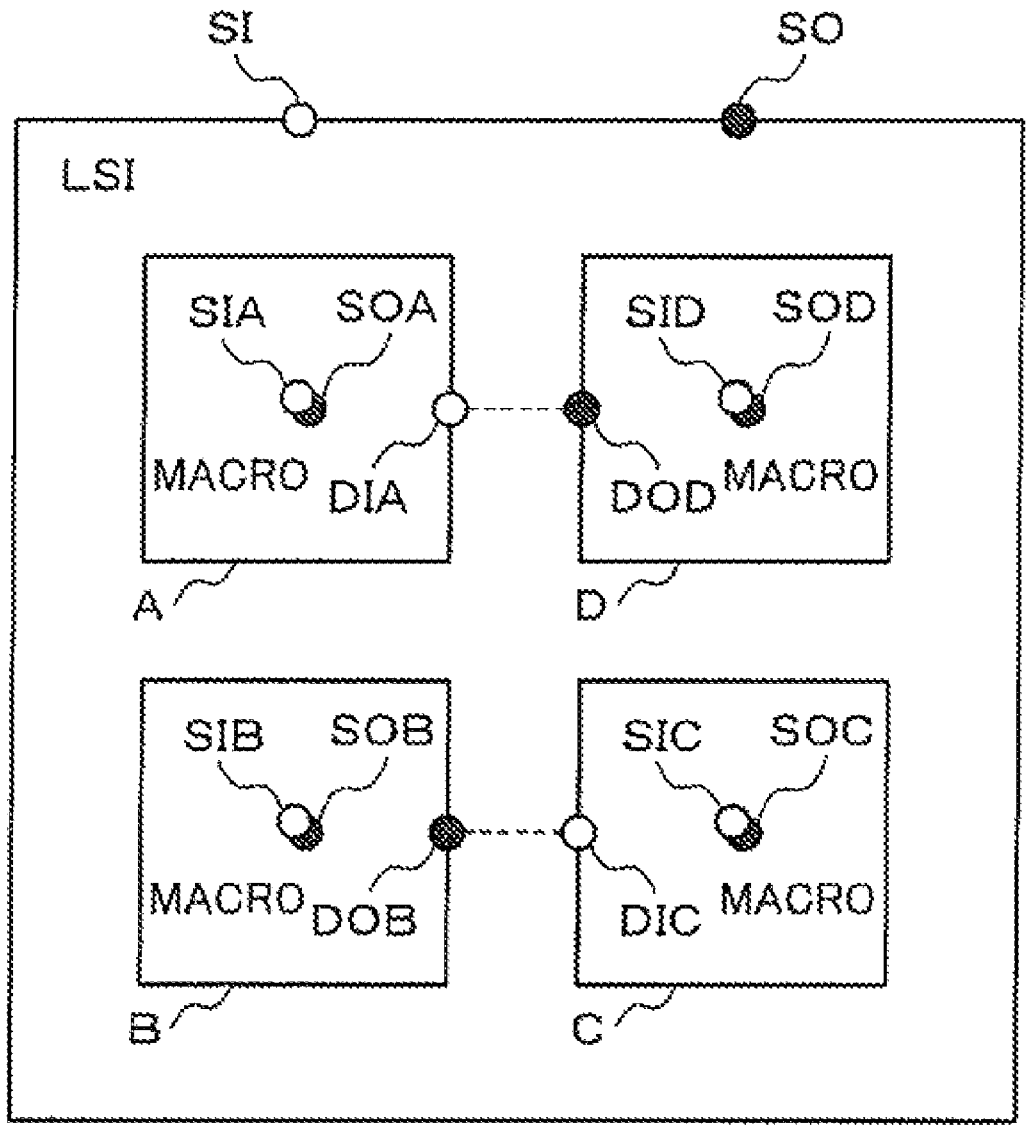
FIG. 17 is a diagram showing the scan-in and the scan-out terminal positions of a macro determined by a macro signal terminal position determination unit of the second exemplary embodiment.

Referring to FIG. 16, the second exemplary embodiment is different from the first exemplary embodiment in the point that it includes input unit 101, general signal terminal position determination unit 102, logical connection information update unit 106, macro scan terminal position determination unit 107 and output unit 108. Additionally, the second exemplary embodiment is different from the first exemplary embodiment memory unit 200 in place of layout information storing unit 122 and scan path connection information storing unit 123. The second exemplary embodiment is also different from the first exemplary embodiment in operation of macro signal terminal position determination unit 103.

Here, before describing each component, the structure of data which each component refers to, generates and updates will be described.

Logical connection information 201 is information that logical connections between scan-in external terminal SI, scan-out external terminal SO and macros A-D as shown in FIG. 2 are converted into digital information as shown in FIG. 3, for example.

In the example shown in FIG. 3, logical connection information 201 includes information which indicates connecting relation of scan-in external terminal SI, scan-out external terminal SO, scan-in terminals SIA, SIB, SIC and SID of macros A-D and scan-out terminals SOA, SOB, SOC and SOD of macros A-D as "from" (one terminal for a certain connection) and "to" (the other terminal connected to the terminal of the "from" side). Logical connection information 201 further includes information which indicates connecting relation of general signal terminals DIA, DOB, DIC, and DOD as "from" and "to".

Input unit 101 inputs logical connection information 201, layout information 202 and scan path connection information 203.

Memory unit 200 stores logical connection information 201, layout information 202, scan path connection information 203 and connection distance table 204.

General signal terminal position determination unit 102 refers to logical connection information 201 and layout information 202, and determines terminal positions of all general signal terminals DIA, DOB, DIC, and DOD of macros A-D so that a connection wiring length between terminals may become shortest based on connecting relation and positional relation between each of macros A-D. Then, general signal terminal position determination unit 102 updates layout information 202 based on this determination.

Macro signal terminal position determination unit 103 updates layout information 202 so that scan-in terminals SIA-SID and scan-out terminals SOA-SOD may be temporary-arranged in a position of macros A-D that does not overlap with the position of general signal terminals DIA, DOB, DIC, and DOD (for example, it may be the centroid position or the center position).

Logical connection information update unit 106 updates logical connection information 201 based on scan path connection information 203 updated by scan path re-routing unit 105.

Macro scan terminal position determination unit 107 refers to scan path connection information 203 updated by scan path re-routing unit 105, and determines a position of scan-in terminals SIA-SID and scan-out terminals SOA-SOD of macros A-D so that the distance between any one of scan-in terminals SIA-SID and one of scan-out terminals SOA-SOD that is connected with the former may become shortest. Then, macro scan terminal position determination unit 107 updates layout information 202 based on this determination.

Output unit 108 outputs logical connection information 201 updated by logical connection information update unit 106, layout information 202 updated by macro scan terminal position determination unit 107 and scan path connection information 203 updated by scan path re-routing unit 105.

Next, operation of this exemplary embodiment will be described in detail with reference to FIGS. 2-6, FIG. 9, FIG. 10 and FIGS. 12-24.

Figure 23:
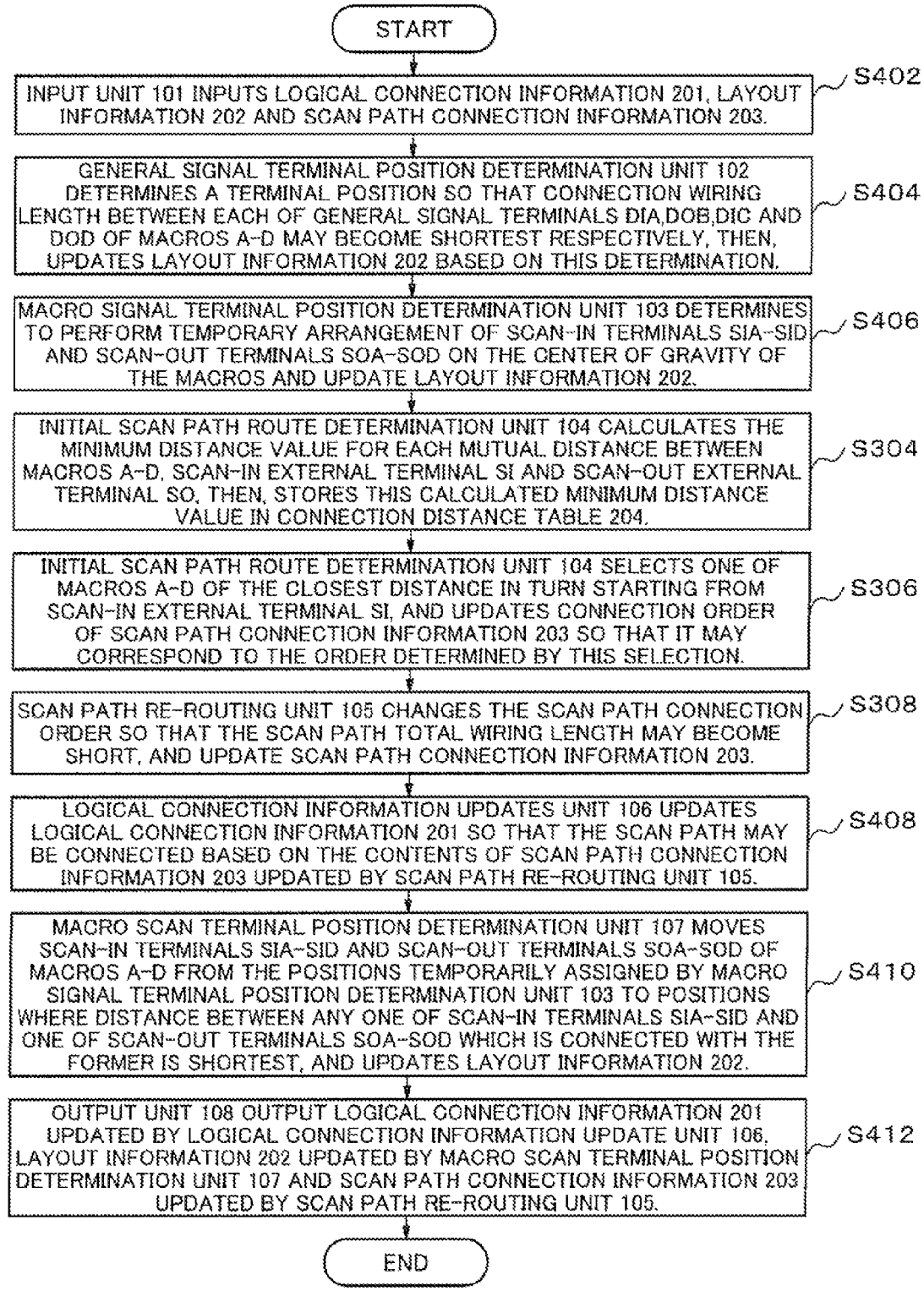
FIG. 23 is a flowchart showing general operation of the second exemplary embodiment.

FIG. 23 is a flowchart showing general operation of this exemplary embodiment.

First, input unit 101 inputs logical connection information 201 as shown in FIG. 3, layout information 202 as shown in FIG. 5 and scan path connection information 203 as shown in FIG. 6, and stores these pieces of information in memory unit 200 (step S402 in FIG. 23).

Input to input unit 101 may be done from a keyboard, for example, or from a computer and the like connected by a network.

Next, general signal terminal position determination unit 102 refers to logical connection information 201 and layout information 202, and determines a terminal position so that the connection wiring length between each of general signal terminals DIA, DOB, DIC, and DOD of macros A-D may become shortest respectively based on connecting relation and positional relation between each macros A-D. Then, general signal terminal position determination unit 102 updates layout information 202 based on this determination (step S404 in FIG. 23).

Next, macro signal terminal position determination unit 103 determines to perform temporary arrangement of scan-in terminals SIA-SID and scan-out terminals SOA-SOD on the center of gravity of the macros. Then, macro signal terminal position determination unit 103 updates layouts information 202 based on this determination (step S406 in FIG. 23).

The terminal positions of macros A-D determined by general signal terminal position determination unit 102 and macro signal terminal position determination unit 103 are shown in FIG. 7. General signal terminals DIA, DOD and general signal terminals DOB, DIC are arranged at a position on a side of macros A-D respectively where the distance becomes shortest. On the other hand, scan-in terminals SIA-SID and scan-out terminals SOA-SOD is arranged temporarily on the center of gravity of respective macros A-D. Meanwhile, in FIG. 7, although scan-in terminal SIA and scan-out terminal SOA are indicated overlapping partially (out of alignment partially) in order to enable them to be identified, actually, they are arranged on the same centroid position in a lapped manner. Terminal layout information 2023 of layout information 202 updated by macro signal terminal position determination unit 103 is shown in FIG. 8.

Description of operation of Steps S304 to S308 of FIG. 23 will be omitted, because it is the same as that of the first exemplary embodiment.

Next, logical connection information update unit 106 updates logical connection information 201 so that the scan path may be connected based on the contents of scan path connection information 203 updated by scan path re-routing unit 105 (step S408 in FIG. 23).

Figures 19, 20:
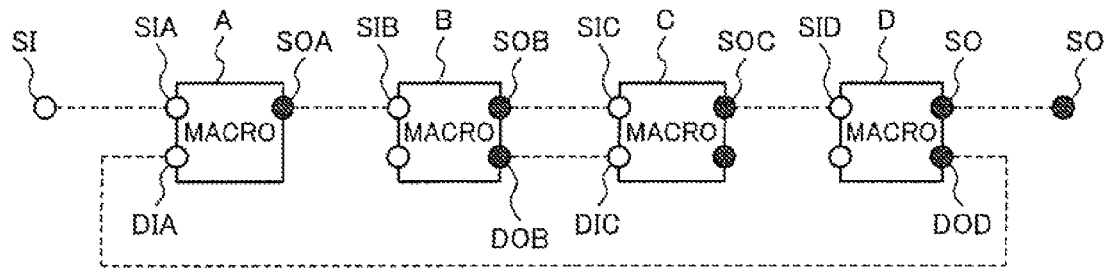
FIG. 19 is a diagram showing the logical connection of an example of a processing object LSI updated by a logical connection information update unit of the first and second exemplary embodiments so that the scan path may be connected based on the contents of scan path connection information updated by a scan path re-routing unit.
FIG. 20 is a diagram showing the logical connection information updated by the logical connection information update unit of the first and second exemplary embodiments.

Specifically, the logical connection is updated as follows, for example. Scan-in external terminal SI is connected with scan-in terminals SIA-SID of macros A-D just after it in Connection order of scan path connection information 203 shown in FIG. 14. Scan-out external terminal SO is connected to scan-out terminals SOA-SOD of macros A-D just before it. Scan-out terminals SOA-SOD of other macros A-D is connected with scan-in terminals SIA-SID of macros A-D of just after each of them. The logical connection of LSI updated by this means is shown in FIG. 19. Updated logical connection information 201 is shown in FIG. 20.

Next, macro scan terminal position determination unit 107 refers to scan path connection information 203 updated by scan path re-routing unit 105. And macro scan terminal position determination unit 107 moves scan-in terminals SIA-SID and scan-out terminals SOA-SOD of macros A-D from the positions assigned by performing temporary arrangement by macro signal terminal position determination unit 103 to positions where the distance between scan-in terminals SIA-SID and scan-out terminals SOA-SOD which is connected with the former is shortest respectively. Then, macro scan terminal position determination unit 107 updates layout information 202 based on the positions which have been moved (step S410 in FIG. 23).

Figure 21:
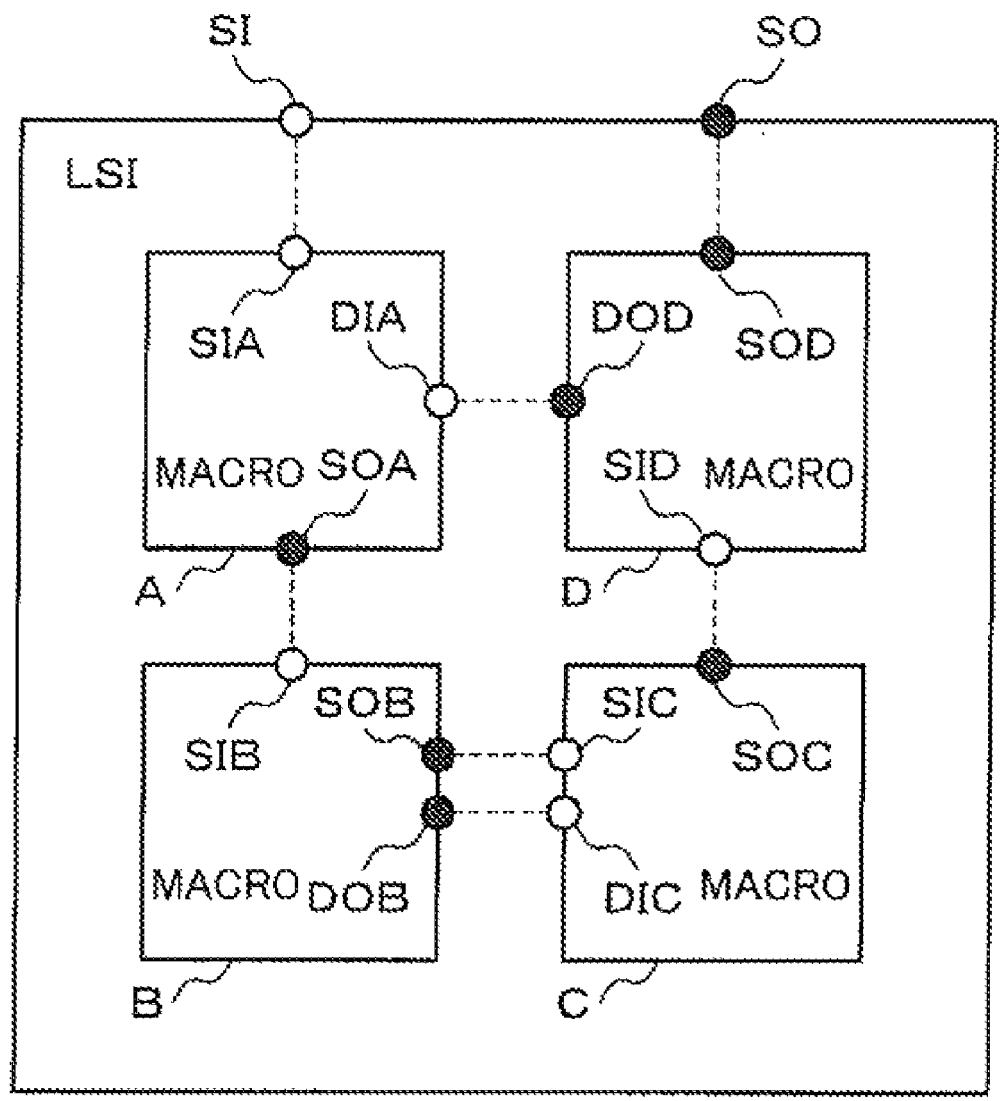
FIG. 21 is a diagram showing a layout of an example of a processing object LSI, the scan-in terminals and the scan-out terminals of which are moved by a macro scan terminal position determination unit of the first and second exemplary embodiments.

In this occasion, macro scan terminal position determination unit 107 moves scan-in terminals SIA-SID and scan-out terminals SOA-SOD of macros A-D such that they do not overlap with the positions of general signal terminal DIA, DOB, DIC, and DOD determined already by macro signal terminal position determination unit 103. A layout of the state that scan-in terminals SIA-SID and scan-out terminals SOA-SOD have been moved by this means is shown in FIG. 21. In layout information 202, terminal layout information 2023 is updated as shown in FIG. 22.

Next, output unit 108 outputs logical connection information 201 updated by logical connection information update unit 106, layout information 202 updated by macro scan terminal position determination unit 107 and scan path connection information 203 updated by scan path re-routing unit 105 to an output destination that is not illustrated (step S412 in FIG. 23).

The output destination that is not illustrated may be a display apparatus or a printer, for example, or may be a computer or the like connected by a network.

Figure 24:
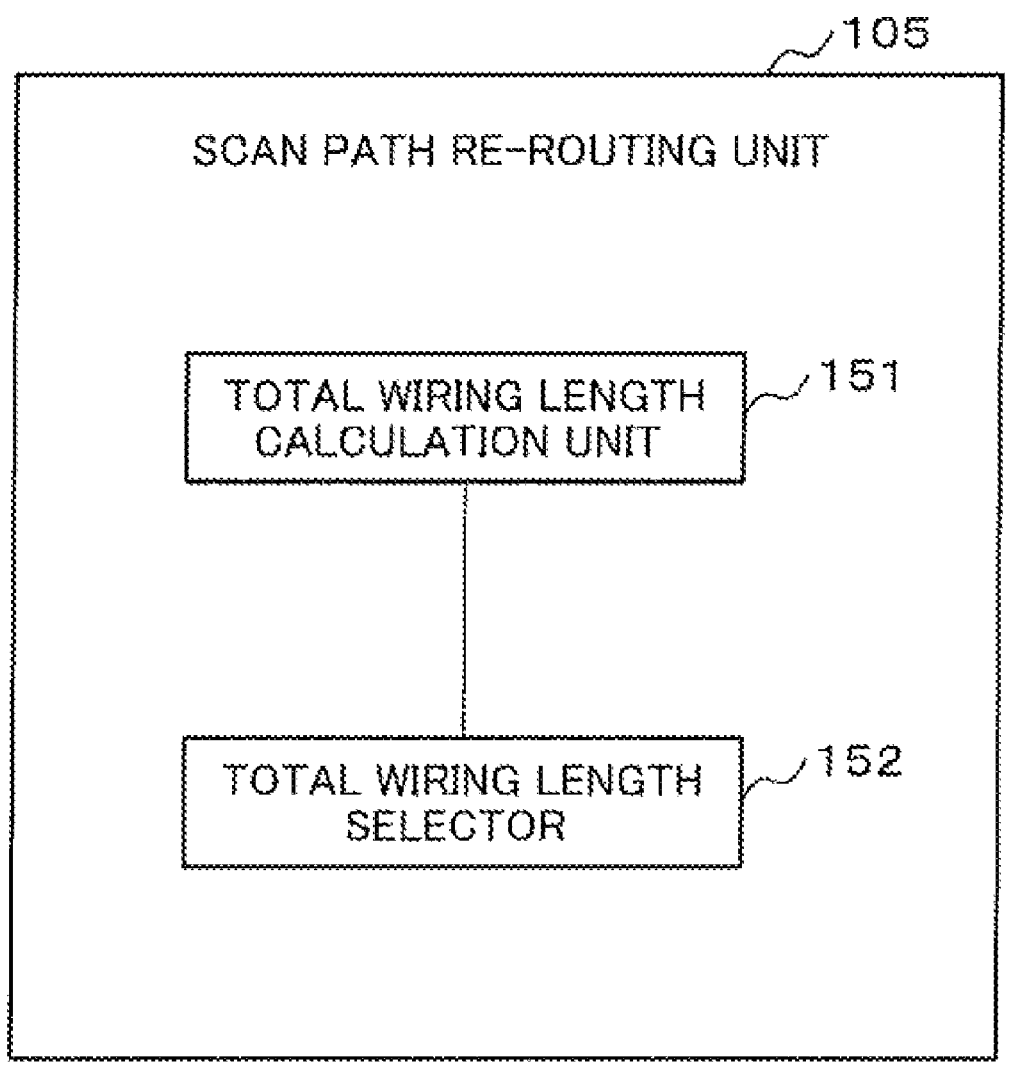
FIG. 24 is a block diagram showing the configuration of a scan path re-routing unit of the second exemplary embodiment.
Figure 25:
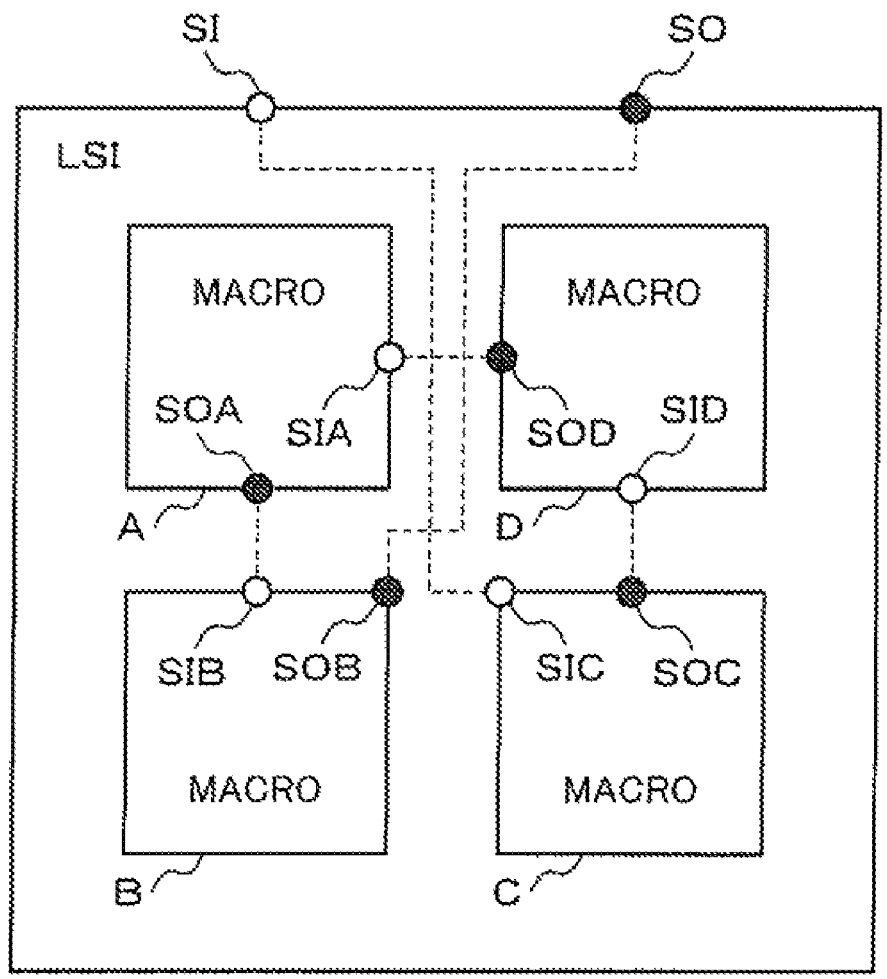
FIG. 25 is a diagram showing the scan path connection order and terminal positions at the time of LSI layout processing in the related art.

Next, an example of an exemplary embodiment of scan path re-routing unit 105 will be described. Referring to FIG. 24, scan path re-routing unit 105 includes total wiring length calculation unit 151 and total wiring length selector 152.

Total wiring length calculation unit 151 calculates a first scan path total wiring length based on scan path connection information 203 determined by initial scan path route determination unit 104. Total wiring length calculation unit 151 also calculates a third scan path total wiring length in the case where the scan path connection order of optional macros A-D among elements of scan path connection information 203 determined by initial scan path route determination unit 104 is changed.

Total wiring length selector 152 adopts the first scan path total wiring length as a second scan path total wiring length. Total wiring length selector 152 also selects shorter one of the second scan path total wiring length and the third scan path total wiring length as a new second scan path total wiring length.

Moreover, total wiring length selector 152 determines the scan path connection order in the case where the third scan path total wiring length calculated by total wiring length calculation unit 151 is less than or equal to a predetermined percentage of the first scan path total wiring length as the scan path connection order in which the scan path total wiring length becomes shortest.

Alternatively, total wiring length selector 152 may determine the scan path connection order corresponding to the new second scan path total wiring length when the number of calculation of the third scan path total wiring length performed by total wiring length calculation unit 151 reaches a predetermined value as the scan path connection order in which the scan path total wiring length becomes shortest.

The effect of the exemplary embodiment mentioned above is that it is possible to obtain terminal layout information in which room for further shortening the scan path total wiring length is reduced as an optimal solution of the scan path total wiring length. The reason is that a position of scan-in/out terminal is determined based on scan path connection information 203 which is updated by changing the scan path connection order so that the scan path total wiring length may become short with reference to logical connection information 201 and layout information 202.

That is, in a layout design of LSI and the like, by performing processing with the following method, there is the effect that it is possible to obtain terminal layout information in which room for further shortening the scan path total wiring length is reduced as an optimal solution of the scan path total wiring length. First, the scan-in and scan-out terminal positions of a hierarchical macro at which performing hierarchical partitioning design are arranged at the centroid position of the macro once temporarily. Following this, in the next processing, optimization processing of a scan path route is performed in consideration of the minimum distance between macros or the minimum distance between terminals for which temporary arrangement have been performed. In the last processing, a position of scan-in/out terminals is determined based on a scan path route for which optimization processing has been performed.

In each component described in each of the above-mentioned exemplary embodiments, certain processing may be executed by a computer using a program.

Each component described in each of the above-mentioned exemplary embodiments is not necessary an entity which is independent individually. And it may be constructed in a form where: a plurality of components are realized as one module; one component is realized as a plurality of modules; a certain component is part of another component; or part of a certain component and part of another component overlap each other.

Further, according to each exemplary embodiment described above, although a plurality of stages of operation have been described sequentially in a form of a flowchart, the order of the descriptions of them does not limit order of execution of these stages. For this reason, when each exemplary embodiment is implemented, order of a plurality of stages of operation can be changed within the range that does not cause a trouble in the operation.

Moreover, in each exemplary embodiment described above, a plurality of stages of operation are not limited to be carried out at different time points each other. For example, one stage of operation may occur during execution of another stage of operation, and timing of execution of a particular stage of operation and that of another stage of operation may overlap partially or entirely.

Furthermore, if needed and possible, each component in each of the exemplary embodiments described above may be realized by hardware, software or both hardware and software in an intermingled manner.

In the technologies indicated on document 1 and document 2 mentioned above, it is not possible to support a function to determine a terminal which is connected to a scan path with reference to the logical connection information which is in a state before scan path optimization, that is, a function to determine it at the time of logical design in advance of floor planning processing. For this reason, there is a problem that the most suitable arrangement position of a terminal of a scan path for reducing the scan path total wiring length cannot be obtained, that is, there is a problem that an optimal solution of the scan path total wiring length obtained here may be a solution in which room for further reducing the scan path total wiring length is remained.

Figure 26:
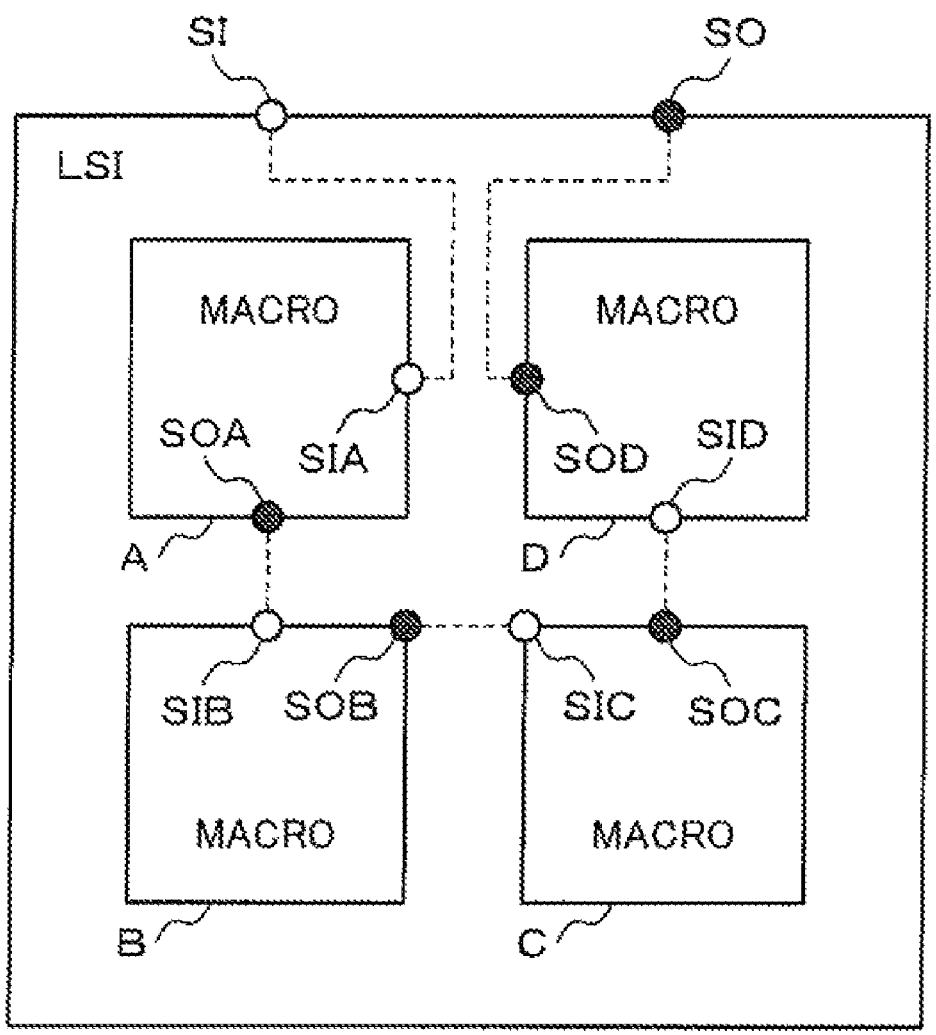
FIG. 26 is a diagram showing the scan path connection order and terminal positions at the time of LSI layout processing in the related art.

As a specific example, referring to FIG. 26, it can be seen that the distance between scan-in external terminal SI and scan-in terminal SIA of macro A and between scan-out external terminal SO and scan-out terminal SOD of macro D is not the minimum distance necessarily.

The present invention can be applied to a layout design support apparatus of an integrated circuit and a layout design support method of an integrated circuit. Caused by increase in scale and speed of LSI and an increasingly fine process, for example, increase of test time of LSI and of the power consumption of a test has come to be a problem, and it is not appropriate any more to test the whole LSI in a lump using a single scan path. For this reason, it is not unusual that even tens or hundreds of scan paths exist in a LSI, and thus negative influence of increase in wiring length of scan paths on wiring characteristics of the whole LSI cannot be ignored any more. The present invention can also be applied to layout design of a scan path including backgrounds like the above.

The previous description of embodiments is provided to enable a person skilled in the art to make and use the present invention. Moreover, various modifications to these exemplary embodiments will be readily apparent to those skilled in the art, and the generic principles and specific examples defined herein may be applied to other embodiments without the use of inventive faculty. Therefore, the present invention is not intended to be limited to the exemplary embodiments described herein but is to be accorded the widest scope as defined by the limitations of the claims and equivalents.

Further, it is noted that the inventor's intent is to retain all equivalents of the claimed invention even if the claims are amended during prosecution.

The invention claimed is:

1. An integrated circuit design apparatus, comprising:
a layout information storing unit which stores layout information that indicates a layout in an integrated circuit;
a scan path connection information storing unit which stores scan path connection information that indicates a connection order of scan path terminals in the integrated circuit;
a macro signal terminal position determination unit which determines temporary arrangement positions of a scan-in terminal and a scan-out terminal of each of a plurality of macros with reference to the layout information, and updates the layout information based on said temporary arrangement positions determined;
an initial scan path route determination unit which updates the scan path connection information such that, about a scan-in external terminal and the plurality of macros, one of the plurality of macros arranged in a closest distance is connected in turn starting with the scan-in external terminal with reference to the layout information updated by the macro signal terminal position determination unit and the scan path connection information; and
a scan path re-routing unit which determines a scan path connection order such that a scan path total wiring length becomes shortest with reference to the layout information updated by the macro signal terminal position determination unit and the scan path connection information updated by the initial scan path route determination unit, and updates the scan path connection information updated by the initial scan path route determination unit based on said determined scan path connection order, wherein
a temporary arrangement position of the scan-in terminal and the scan-out terminal of each of the plurality of macros is a centroid position or a center position of said macro.

2. The integrated circuit design apparatus according to claim 1, wherein
the initial scan path route determination unit performs:
calculation of a minimum distance value of respectively mutual distance between the scan-in external terminal, the scan-out external terminal and each of the plurality of macros;
selection of one of the plurality of macros closest from the scan-in external terminal first based on the minimum distance value that has been calculated;
selection of another one of the plurality of macros that is closest from the selected macro and that has not been selected yet in turn; and
update of the scan path connection information such that the scan-in external terminal and each of the plurality of macros in order which said macros were selected and the scan-out external terminal are connected in this order.

3. The integrated circuit design apparatus according to claim 2, wherein
the scan path re-routing unit comprises:
a total wiring length calculation unit which calculates a first scan path total wiring length based on the scan path connection information determined by the initial scan path route determination unit, and a second scan path total wiring length in a case where an order of scan path connection of any of the plurality of macros among elements of the scan path connection information is changed; and
a total wiring length selector which determines the scan path connection order in a case where the second scan path total wiring length calculated by the scan path re-routing unit is less than or equal to a predetermined percentage of the first scan path total wiring length as the scan path connection order in which the scan path total wiring length becomes shortest.

4. The integrated circuit design apparatus according to claim 3, further comprising:
a logical connection information storing unit which stores logical connection information that indicates a logical connection in the integrated circuit; and
a general signal terminal position determination unit which determines, for each of all general signal terminals of each of the plurality of macros, a terminal position where a connection wiring length between terminals becomes shortest with reference to the logical connection information and the layout information, and updates the layout information based on said determination.

5. The integrated circuit design apparatus according to claim 4, further comprising:
a logical connection information update unit which updates the logical connection information based on the scan path connection information updated by the scan path re-routing unit; and
a macro scan terminal position determination unit which determines positions of the scan-in terminal and the scan-out terminal of each of the plurality of macros respectively at the terminal position which is not being used by other signals of said macro such that the distance between the scan-in terminal and the scan-out terminal that are connected become shortest with reference to the scan path connection information updated by the scan path re-routing unit and the logical connection information updated by the logical connection information update unit, and updates the layout information updated by the general signal terminal position determination unit based on said position determined.

6. The integrated circuit design apparatus according to claim 2, wherein
the scan path re-routing unit comprises:
a total wiring length calculation unit which calculates a first scan path total wiring length based on the scan path connection information determined by the initial scan path route determination unit, and the second scan path total wiring length in a case where an order of scan path connection of any of the plurality of macros among elements of the scan path connection information is changed; and
a total wiring length selector which adopts said first scan path total wiring length as a third scan path total wiring length, adopts shorter one of the second scan path total wiring length and the third scan path total wiring length as a new third scan path total wiring length, and determines the scan path connection order corresponding to the new third scan path total wiring length when a number of calculation of the second scan path total wiring length reaches a predetermined value as the scan path connection order in which the scan path total wiring length becomes shortest.

7. A design method executed by an integrated circuit design apparatus, comprising:
a first update step, performed by the integrated circuit design apparatus, for determining temporary arrangement positions of a scan-in terminal and a scan-out terminal of each of a plurality of macros with reference to layout information that indicates a layout in an integrated circuit stored in a layout information storing unit, and for updating the layout information based on said temporary arrangement position determined;
a second update step, performed by the integrated circuit design apparatus, for updating a scan path connection information such that, about a scan-in external terminal and the plurality of macros, one of the plurality of macros arranged in a closest distance is connected in turn starting with the scan-in external terminal with reference to the layout information updated in the first update step and scan path connection information stored in a scan path connection information storing unit that indicates a connection order of scan path terminals in the integrated circuit; and
a third update step, performed by the integrated circuit design apparatus, for determining a scan path connection order such that a scan path total wiring length becomes shortest with reference to the layout information updated in the first update step and the scan path connection information updated in the second update step, and for updating the scan path connection information updated in the second update step based on said determined scan path connection order, wherein
a temporary arrangement position of the scan-in terminal and the scan-out terminal of each of the plurality of macros is a centroid position or a center position of said macro in each of the plurality of macros.

8. The design method according to claim 7, wherein
the first update step comprises the steps of:
calculating a minimum distance value of respectively mutual distance between the scan-in external terminal, the scan-out external terminal and each of the plurality of macros;
selecting one of the plurality of macros closest from the scan-in external terminal first based on the minimum distance value that has been calculated;
selecting another one of the plurality of macros that is closest from the selected macro and that has not been selected yet in turn; and
updating the scan path connection information such that the scan-in external terminal and each of the plurality of macros in order which said macros were selected and the scan-out external terminal are connected in this order.

9. The design method according to claim 8, wherein
said third update step comprises the steps of:
calculating a first scan path total wiring length based on the scan path connection information determined by the second update step;
calculating a second scan path total wiring length in a case where an order of scan path connection of any of the plurality of macros among elements of the scan path connection information is changed; and
determining the scan path connection order in a case where the second scan path total wiring length calculated is less than or equal to a predetermined percentage of the first scan path total wiring length as the scan path connection order in which scan path total wiring length becomes shortest.

10. The design method according to claim 9, further comprising:
a fourth update step for determining, for each of all general signal terminals of each of the plurality of macros, a terminal position where a connection wiring length between terminals becomes shortest with reference to logical connection information that indicates a logical connection in the integrated circuit and the layout information, and updating the layout information based on said determination.

11. The design method according to claim 8, wherein
the third update step comprises the steps of:
calculating a first scan path total wiring length based on the scan path connection information determined in the second update step;
calculating a second scan path total wiring length in a case where an order of scan path connection of any of the plurality of macros among elements of the scan path connection information is changed;
adopting the first scan path total wiring length as a third scan path total wiring length;
adopting shorter one of the second scan path total wiring length and the third scan path total wiring length as a new third scan path total wiring length;
determining the scan path connection order corresponding to the new third scan path total wiring length when the number of calculations of the second scan path total wiring length reaches a predetermined value as the scan path connection order in which the scan path total wiring length becomes shortest.

12. The design method according to claim 11, further comprising the steps of:
   updating the logical connection information based on the scan path connection information updated in the third update step;
   determining positions of the scan-in terminal and the scan-out terminal of each of the plurality of macros respectively at the terminal position which is not being used by other signals of said macro such that a distance between the scan-in terminal and the scan-out terminal that are connected becomes shortest with reference to the scan path connection information updated in the third update step and said updated logical connection information; and
   updating the layout information updated in the fourth update step based on said position determined.

13. An integrated circuit design apparatus, comprising:
   a layout information storage means for storing layout information that indicates a layout in an integrated circuit;
   a scan path connection information storage means for storing scan path connection information that indicates a connection order of scan path terminals in the integrated circuit;
   a macro signal terminal position determination means for determining temporary arrangement positions of a scan-in terminal and a scan-out terminal of each of a plurality of macros with reference to the layout information, and updating the layout information based on said temporary arrangement positions determined;
   an initial scan path route determination means for updating the scan path connection information such that, about a scan-in external terminal and the plurality of macros, one of the plurality of macros arranged in a closest distance is connected in turn starting with the scan-in external terminal with reference to the layout information updated by the macro signal terminal position determination means and the scan path connection information; and
   a scan path re-routing means for determining a scan path connection order such that the scan path total wiring length becomes shortest with reference to the layout information updated by the macro signal terminal position determination means and the scan path connection information updated by the initial scan path route determination means, and for updating the scan path connection information updated by the initial scan path route determination means based on said determined scan path connection order, wherein
   a temporary arrangement position of the scan-in terminal and the scan-out terminal of each of the plurality of macros is a centroid position or a center position of said macro.

* * * * *